US011094375B2

(12) United States Patent
Intrater et al.

(10) Patent No.: US 11,094,375 B2
(45) Date of Patent: *Aug. 17, 2021

(54) CONCURRENT READ AND RECONFIGURED WRITE OPERATIONS IN A MEMORY DEVICE

(71) Applicant: Adesto Technologies Corporation, Santa Clara, CA (US)

(72) Inventors: Gideon Intrater, Sunnyvale, CA (US); Bard Pedersen, Fremont, CA (US); Shane Hollmer, Grass Valley, CA (US); Derric Lewis, Sunnyvale, CA (US); Stephen Trinh, San Jose, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/807,320

(22) Filed: Mar. 3, 2020

(65) Prior Publication Data

US 2020/0202924 A1 Jun. 25, 2020

Related U.S. Application Data

(63) Continuation of application No. 15/568,713, filed as application No. PCT/US2016/030473 on May 2, 2016, now Pat. No. 10,636,480.

(Continued)

(51) Int. Cl.
*G11C 11/419* (2006.01)
*G11C 16/10* (2006.01)
(Continued)

(52) U.S. Cl.
CPC .............. *G11C 11/419* (2013.01); *G11C 7/22* (2013.01); *G11C 8/12* (2013.01); *G11C 13/004* (2013.01);
(Continued)

(58) Field of Classification Search
CPC ... G11C 11/419; G11C 29/021; G11C 29/028; G11C 7/22; G11C 8/12; G11C 13/0011;
(Continued)

(56) References Cited

U.S. PATENT DOCUMENTS 5,097,303 A 3/1992 Taguchi
6,160,750 A 12/2000 Shieh
(Continued)

FOREIGN PATENT DOCUMENTS

WO 2007121025 A1 10/2007

*Primary Examiner* — Sultana Begum
(74) *Attorney, Agent, or Firm* — Michael C. Stephens, Jr.

(57) ABSTRACT

A method of controlling a memory device can include: receiving, by an interface, a write command from a host; beginning execution of a write operation on a first array plane of a memory array in response to the write command, where the memory array includes a plurality of memory cells arranged in a plurality of array planes; receiving, by the interface, a read command from the host; reconfiguring the write operation in response to detection of the read command during execution of the write operation; beginning execution of a read operation on a second array plane in response to the read command; and restoring the configuration of the write operation after the read operation has at least partially been executed.

20 Claims, 25 Drawing Sheets

Related U.S. Application Data

(60) Provisional application No. 62/161,808, filed on May 14, 2015, provisional application No. 62/252,851, filed on Nov. 9, 2015.

(51) Int. Cl.

| | | |
|---|---|---|
| *G11C 7/22* | (2006.01) | |
| *G11C 8/12* | (2006.01) | |
| *G11C 13/00* | (2006.01) | |
| *G11C 16/26* | (2006.01) | |
| *G11C 16/34* | (2006.01) | |
| *G11C 29/02* | (2006.01) | |
| *G11C 5/14* | (2006.01) | |

(52) U.S. Cl.
CPC ...... *G11C 13/0011* (2013.01); *G11C 13/0061* (2013.01); *G11C 13/0064* (2013.01); *G11C 13/0069* (2013.01); *G11C 16/10* (2013.01); *G11C 16/26* (2013.01); *G11C 16/3459* (2013.01); *G11C 29/021* (2013.01); *G11C 29/028* (2013.01); *G11C 5/141* (2013.01); *G11C 2207/2209* (2013.01); *G11C 2211/5623* (2013.01); *G11C 2216/22* (2013.01)

(58) Field of Classification Search
CPC .............. G11C 13/004; G11C 13/0061; G11C 13/0064; G11C 13/0069; G11C 16/10; G11C 16/26; G11C 16/3459; G11C 5/141; G11C 2207/2209; G11C 2216/22; G11C 2211/5623

See application file for complete search history.

(56) References Cited

U.S. PATENT DOCUMENTS

| | | |
|---|---|---|
| 6,182,189 B1 | 1/2001 | Alexis et al. |
| 6,226,732 B1 | 5/2001 | Pei et al. |
| 8,498,164 B1 | 7/2013 | Hollmer et al. |
| 2003/0081489 A1 | 5/2003 | Scheuerlein et al. |
| 2004/0156235 A1 | 8/2004 | Bellini et al. |
| 2005/0081013 A1 | 4/2005 | Pekny et al. |
| 2005/0249021 A1 | 11/2005 | Suh |
| 2006/0117155 A1 | 6/2006 | Ware et al. |
| 2009/0052253 A1 | 2/2009 | Im |
| 2011/0096611 A1 | 4/2011 | Lee et al. |
| 2012/0124449 A1 | 5/2012 | Mirichigni |
| 2012/0155173 A1 | 6/2012 | Lee et al. |
| 2012/0179860 A1 | 7/2012 | Falanga et al. |
| 2012/0243319 A1 | 9/2012 | Kasai et al. |
| 2013/0268726 A1 | 10/2013 | Guo et al. |
| 2014/0063922 A1 | 3/2014 | Kim et al. |
| 2020/0082883 A1* | 3/2020 | Balluchi ............ G11C 13/0097 |
| 2020/0202934 A1* | 6/2020 | Imamoto ................ G11C 16/08 |

* cited by examiner

2300

| Physical | | 0 | 4 | 8 | 12 | 16 | 20 | 24 | 28 | 32 = 0 |
|---|---|---|---|---|---|---|---|---|---|---|
| 7 | 111 | | | | | | | | | |
| 6 | 110 | 16 | 16 | 16 | 16 | 16 | | | 4 | 16 |
| 5 | 101 | | | | | | 4 | 4 | 4 | |
| 4 | 100 | 8 | 8 | 8 | | 8 | 4 | | 8 | 8 |
| 3 | 011 | | | | 4 | | | 16 | | |
| 2 | 010 | 4 | 4 | 4 | 4 | 4 | 16 | | 16 | 4 |
| 1 | 001 | 4 | 4 | 4 | 8 | | | | | 4 |
| 0 | 000 | 4 | 4 | 4 | | 4 | 4 | 4 | | 4 |
| | | Unchanged | Unchanged | Unchanged | Flip bit 20 | Unchanged | Flip bit 21 | | Flip 21&20 | Unchanged |

| Physical | | Logical | | | | | | | | |
|---|---|---|---|---|---|---|---|---|---|---|
| 7 | 111 | 111 | 111 | 111 | 111 | 111 | 011 | 011 | 001 | 111 |
| 6 | 110 | 110 | 110 | 110 | 110 | 110 | 010 | 010 | 000 | 110 |
| 5 | 101 | 101 | 101 | 101 | 101 | 101 | 001 | 001 | 011 | 101 |
| 4 | 100 | 100 | 100 | 100 | 100 | 100 | 000 | 000 | 010 | 100 |
| 3 | 011 | 011 | 011 | 011 | 001 | 011 | 111 | 111 | 111 | 011 |
| 2 | 010 | 010 | 010 | 010 | 000 | 010 | 110 | 110 | 110 | 010 |
| 1 | 001 | 001 | 001 | 001 | 011 | 001 | 101 | 101 | 101 | 001 |
| 0 | 000 | 000 | 000 | 000 | 010 | 000 | 100 | 100 | 100 | 000 |
| | | Unchanged | Unchanged | Unchanged | Flip bit 20 | Unchanged | Flip bit 21 | | Flip 21&20 | Unchanged |

FIG. 23

CONCURRENT READ AND RECONFIGURED WRITE OPERATIONS IN A MEMORY DEVICE

RELATED APPLICATIONS

This application is a continuation of the following application, U.S. patent application Ser. No. 15/568,713, filed on Oct. 23, 2017, and which is hereby incorporated by reference as if it is set forth in full in this specification, and which is the National Stage of International Application No. PCT/US16/030473, filed May 2, 2016, and which also claims the benefit of U.S. Provisional Application No. 62/161,808, filed May 14, 2015, and of U.S. Provisional Application No. 62/252,851, filed Nov. 9, 2015, and all of which are incorporated herein by reference in their entirety.

FIELD OF THE INVENTION

The present invention generally relates to the field of semiconductor devices. More specifically, embodiments of the present invention pertain to memory devices, such as flash memory devices, resistive random-access memory (ReRAM), and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory and other NVM memories have limitations, such as a relatively slow write operation speed. In addition, NVM devices that use bus protocols, such as the serial peripheral interface (SPI) may not be able to perform read operations while the above mentioned slow write operations are in progress. This can severely limit the usage of such NVM devices in systems that execute instructions directly out of the NVM device.

BRIEF DESCRIPTION OF THE DRAWINGS

FIG. 23 is a diagram of an example address mapping for array zone configuration, in accordance with embodiments of the present invention.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to memory devices, including non-volatile memory (NVM), such as flash memory devices, and/or resistive switching memories (e.g., conductive bridging random-access memory [CBRAM], resistive RAM [ReRAM], etc.). Particular embodiments can include structures and methods of operating flash and/or resistive switching memories that can be written (programmed/erased) between one or more resistance and/or capacitive states. In one particular example, a CBRAM storage element may be configured such that when a forward or reverse bias greater than a threshold voltage is applied across electrodes of the CBRAM storage element, the electrical properties (e.g., resistance) of the CBRAM storage element can change. In any event, certain embodiments are suitable to any type of memory device, and in particular NVM devices, such as flash memory, and may include resistive switching memory devices in some cases.

Figure 1:
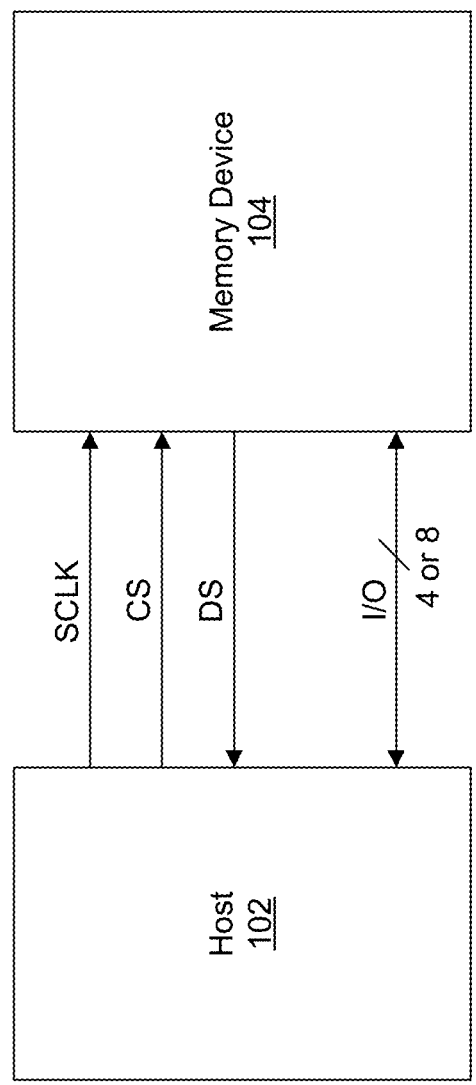
FIG. 1 is an example memory device and host arrangement, in accordance with embodiments of the present invention.

Referring now to FIG. 1, shown is an example memory device and host arrangement 100, in accordance with embodiments of the present invention. In this example, host 102 can interface with memory device 104 via a serial interface. For example, host 102 can be any suitable controller (e.g., CPU, MCU, general-purpose processor, GPU, DSP, etc.), and memory device 104 can be any type of memory device (e.g., SRAM, DRAM, EEPROM, Flash, CBRAM, magnetic RAM, ReRAM, etc.). Memory device 104 can thus be implemented in a variety of memory technologies, such as non-volatile types. In some cases, memory device 104 can be a serial flash memory that may be implemented in more traditional non-volatile memories, or in CBRAM/ReRAM resistive switching memories.

Various interface signals, such as in a serial peripheral interface (SPI), can be included for communication between host 102 and memory device 104. For example, serial clock (SCK) can provide a clock to device 104, and may be used to control the flow of data to the device. Command, address, and input data (e.g., via I/O pins) can be latched by memory device 104 on a rising edge of SCK, while output data (e.g., via I/O pins) can be clocked out of memory device 104 by data strobe (DS) or SCK. Chip select (CS), which may be active low, can be utilized to select memory device 104, such as from among a plurality of such memory devices sharing a common bus or circuit board, or otherwise as a way to access the device. When the chip select signal is de-asserted (e.g., at a high level), memory device 104 can be deselected, and placed in a standby mode. Activating the chip select signal (e.g., via a high to low transition on CS) may be utilized to start an operation, and returning the chip select signal to a high state can be utilized for terminating an operation. For internally self-timed operations (e.g., a program or erase cycle), memory device 104 may not enter standby mode until completion of the particular ongoing operation if chip select is de-asserted during the operation.

In the example interface, data can be provided to (e.g., for write operations, other commands, etc.) and from (e.g., for read operations, verify operations, etc.) memory device 104 via the I/O signals. For example, input data on the I/O can be latched by memory device 104 on edges of SCK, and such input data can be ignored if the device is deselected (e.g., when the chip select signal is de-asserted). Data can be output from memory device 104 via the I/O signals as well. For example, data output from memory device 104 can be clocked out on edges of SCK or DS for timing consistency, and the output signal can be in a high impedance state when the device is deselected (e.g., when the chip select signal is de-asserted).

Particular embodiments are suitable to any form of non-volatile memory (NVM), or any other type of memory in which write operations are significantly slower than read operations, and which may include flash memory, R-RAM, M-RAM, E2ROM, and CBRAM, to name a few. As described herein, a write operation may be any operation on a memory (e.g., NVM) device that is intended to change a state of at least one of the memory locations on the device. As discussed above, write operations can include program operations (e.g., to change a data state from 1 to 0) and erase operations (e.g., to change a data state from 0 to 1). Of course, the data states and/or resistance levels of the storage element can be predefined in any suitable way; however, the write operation can generally involve ensuring that a memory cell is put into or remains in the desired state.

As described herein, an in-place execution is a central processing unit (CPU) mode of operation whereby the NVM is part of the program memory hierarchy. In such an arrangement, at least some of the program may be fetched directly out of the NVM and into the CPU and/or an associated cache. However, in systems that do not support in-place execution, the contents of the NVM may first be copied into a memory device in the memory hierarchy, and then the program can be fetched from that memory device by the CPU. Also as described herein, a serial NVM device can be an NVM device with an interface to the host CPU that is serial in nature. For example, such serial types of interfaces can include serial peripheral interface (SPI) and inter-integrated circuit (I2C). Also, many NVM devices have time-wise asymmetrical read and write operations, whereby the write operations (e.g., erase operations) may take a significantly longer time than read operations.

In many applications, the CPU can execute in-place (e.g., perform program fetches/reads) directly out of the NVM, while the CPU may occasionally write into the NVM. However, conventional NVM devices may not allow performing a read operation while a write operation is in progress. As a result, the processor may not be able to fetch instructions for a relatively long period of time, in some cases. Furthermore, since there is no "backpressure" mechanism in most serial interfaces, the memory may not be able to extend a CPU fetch by adding wait-states. Thus, if the processor issues a fetch request while the memory is performing a write operation, the fetched data may be corrupted, or may otherwise not be usable.

To avoid crashing the system, such as due to retrieving corrupted data, the processor may need to have an alternative program memory (e.g., an on-chip ROM or RAM) from which a program can be executed (e.g., including program fetches/reads) during such write operations to the NVM. However, this approach can be cumbersome, less flexible than having the program code in a modifiable NVM, and may be more difficult to maintain. To ensure correct operation, the system may be designed such that the CPU may not attempt to fetch its program from the NVM while a write operation is in progress. As some events, such as interrupts, are asynchronous to the control flow of the CPU, these can be disabled or their service code can be placed in an alternative memory array. Further, in some cases, this approach may have lower performance than having program code residing in an NVM, whereby the processor could continue executing a program while the NVM is being written.

In another approach, the CPU can send an explicit request to the NVM to "pause" or otherwise reconfigure the write operation that is in progress. Doing this may require dedicated hardware in the host interface (e.g., a block that translates CPU requests into NVM commands) that can be aware of the NVM performing a write operation while the CPU is attempting to perform a program fetch from the NVM. However, this approach may reduce the system performance due to, among other things, the extra latency that may be added by sending the "pause" or "reconfigure write" request, as well as the time it takes for the NVM to accommodate the pause request. Many serial NVM devices have a specific command that pauses the write operation when given. In such a case, when the write operation is paused, the NVM can be read. Also, another command can be used to resume the paused write operation.

Such a pause or related command could be used each time that the processor needs to perform a fetch from the NVM. To accomplish this, a smart NVM interface on the CPU chip may be informed that a write operation on the NVM is in progress. Each time the host interface detects a CPU fetch/read request, the NVM read command can be preceded by a pause request to pause the write operation on the NVM, and then the host interface may follow by a resume request to resume that write operation. However, many serial NVM devices require 100 s of uSec in order to implement the pause operation, thus making this approach relatively slow for relatively fast CPUs.

Some NVM devices with a parallel interface can support true concurrent read and write operations. Such devices may fully duplicate circuitry in order to allow for this concurrency in operations. In addition to the extra silicon required for this circuitry duplication, there can be a design challenge of ensuring that electrical noise created by one operation does not impact the other operation. One example of such an electrical noise issue involves a write operation that generally requires the generation of a high-voltage with an on-chip switching power source/supply, as well as charge pump circuitry. The switching and/or pumping can be very noisy, and may impact operation of the relatively sensitive sense amplifiers that are used for the read operation. Thus, noise from a write operation can cause circuit operation problems for a read operation when performed concurrently.

In particular embodiments, a memory device (e.g., an NVM) can automatically detect one or more read operations while the NVM is performing a write operation, may relatively quickly reconfigure (e.g., pause/suspend, slow down, alter the write routine/algorithm, utilize different configuration registers, and/or change regulator operation, etc.) the write operation in response thereto, and then may restore (e.g., return to the previous or normal configuration) the write operation when it is safe to do so relative to execution of the read operation. For example, it may be considered safe to return to the normal operation once the read operation is far enough along so as to not be affected by any potential noise (e.g., due to supply pumps from the write operation). Also, the reconfiguring of the write operation may be with either no change or a minimal change in the timing of the read operation. Further, the reconfiguration of such a write operation may not need to be absolute. Rather, enough write-related circuitry may be stopped, slowed down, disabled, or otherwise reconfigured such that the read operation can be executed correctly. In other cases, the write "reconfiguration" may simply be allowing the read operation to occur in concurrent fashion, and without a substantial adjustment to the write operation itself.

In certain embodiments, reconfiguring the write operation can be done in order to reduce electrical noise in the chip that could lead to errors in reading the memory array. The reconfiguration may address both direct noise caused by the program or erase operations, as well as may reduce power consumed from on-chip charge pumps and regulators. This, in turn, can also reduce noise generated by the regulators or charge pumps. Thus, the write functionality can be modified to accommodate a concurrent read operation in order to reduce noise and/or power. Various aspects of the write operation can be reconfigured in certain embodiments, such as including modification of control logic based on a serial output mode, switching to a different set of write configurations (e.g., write pulse width, write current, etc.), and/or switching to a different write algorithm/routine or finite state machine (FSM), just to name a few.

As described herein, such a reconfiguration of the write operation may interchangeably be referred to as a "reconfigured write," a "pause," an "auto-suspend," a "stall," a "slow down," or a "suspension" of the write operation, and/or the execution thereof, due to an "interruption" by a read operation. In addition, the memory array can be arranged in different portions, whereby a write operation to one such portion can be interrupted by a read to another such portion. As described herein, such a memory array "portion" of sub-array may interchangeably be referred to as a "plane," a "block," a "zone," a "bank," or a "region." Thus for example, the NVM memory cells may reside in one plane or another plane on an NVM device. Also in particular embodiments, more than two planes (e.g., N planes) of NVM memory cells can be accommodated. Further, arrangements of the array portions into such planes can be configured on the NVM device.

Figure 2:
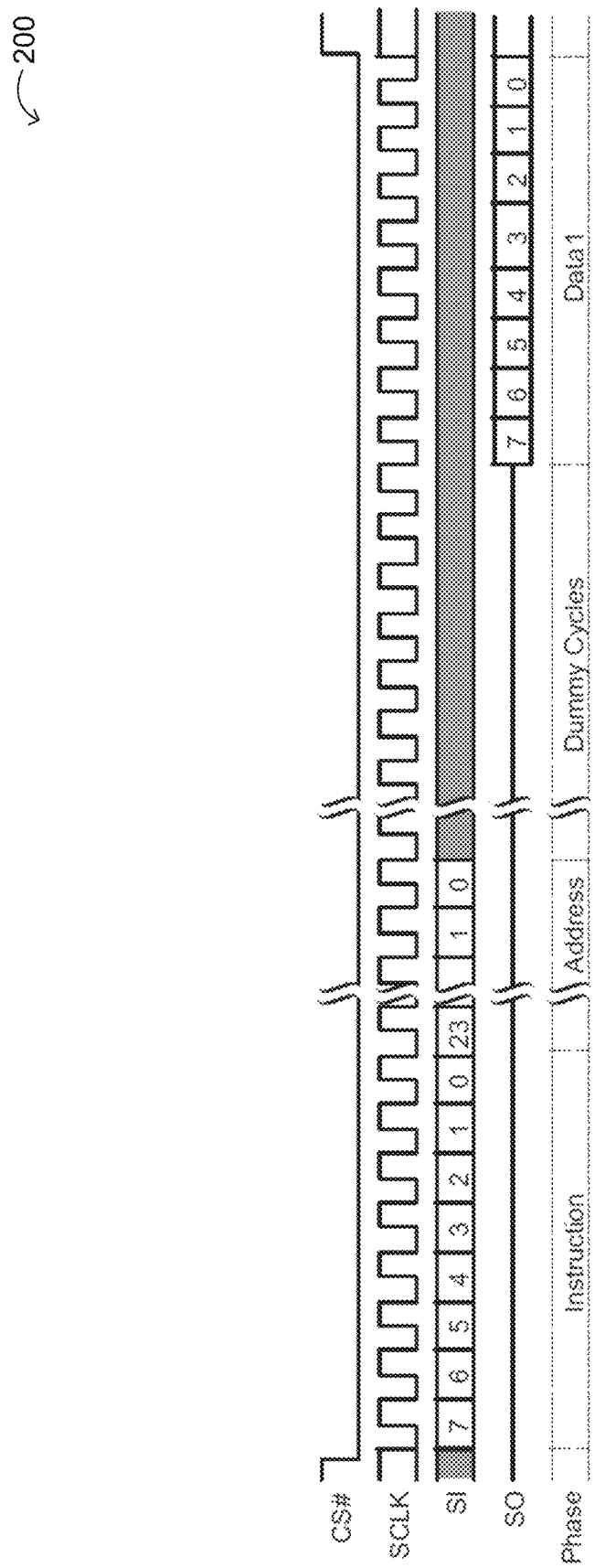
FIG. 2 is a waveform diagram of an example fast read command sequence.
Figure 3:
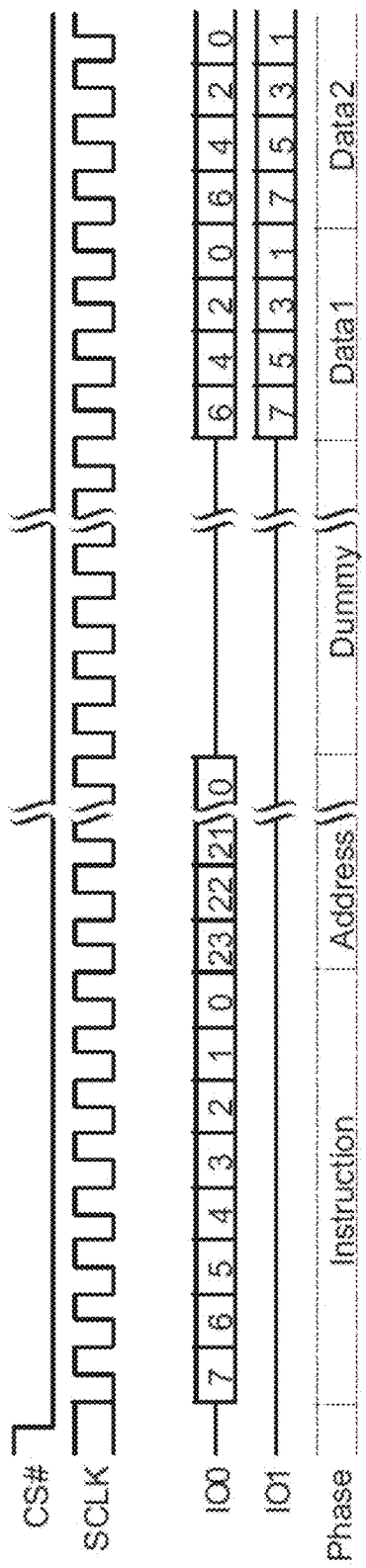
FIG. 3 is a waveform diagram of an example fast read dual output command sequence.
Figure 4:
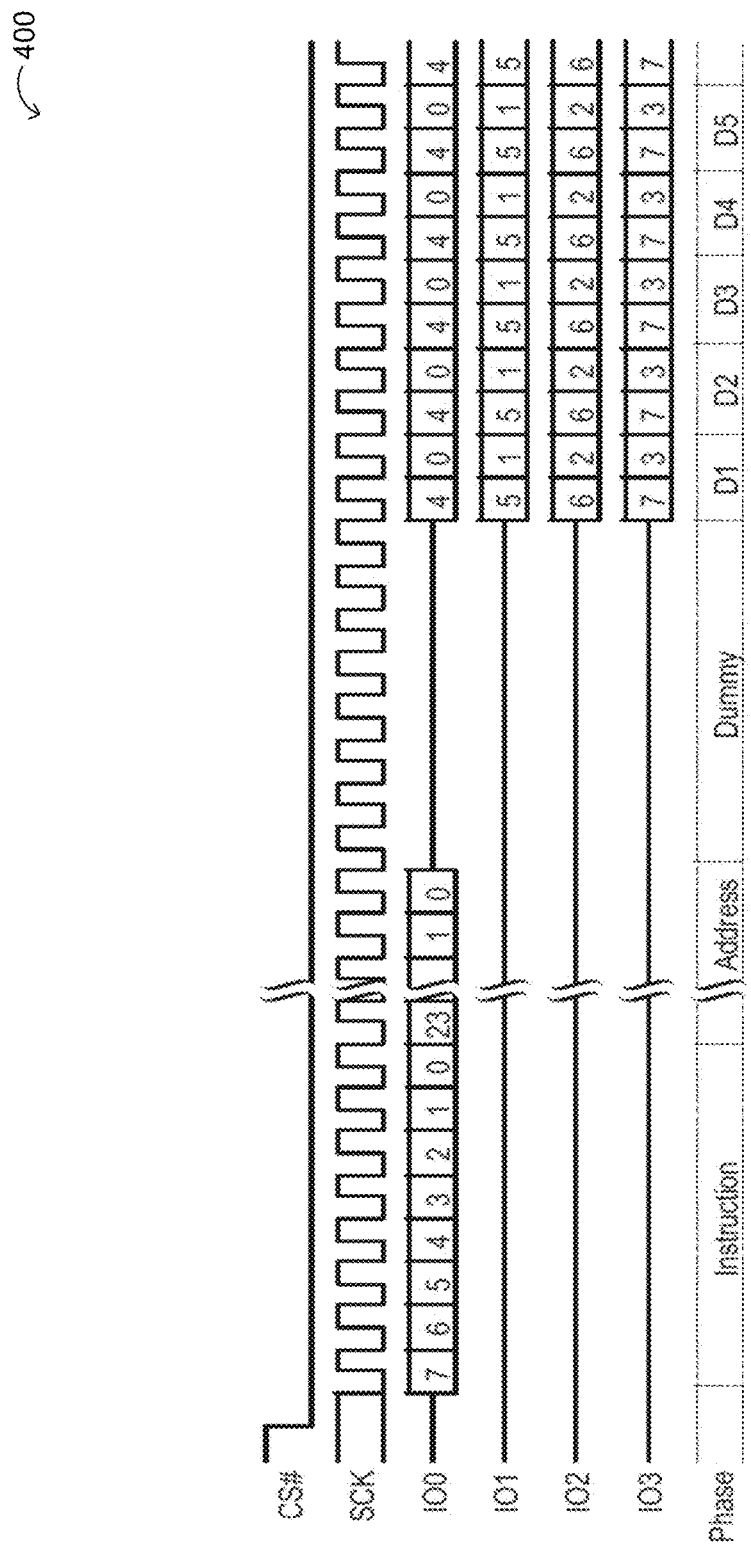
FIG. 4 is a waveform diagram of an example fast read quad output command sequence.
Figure 5:
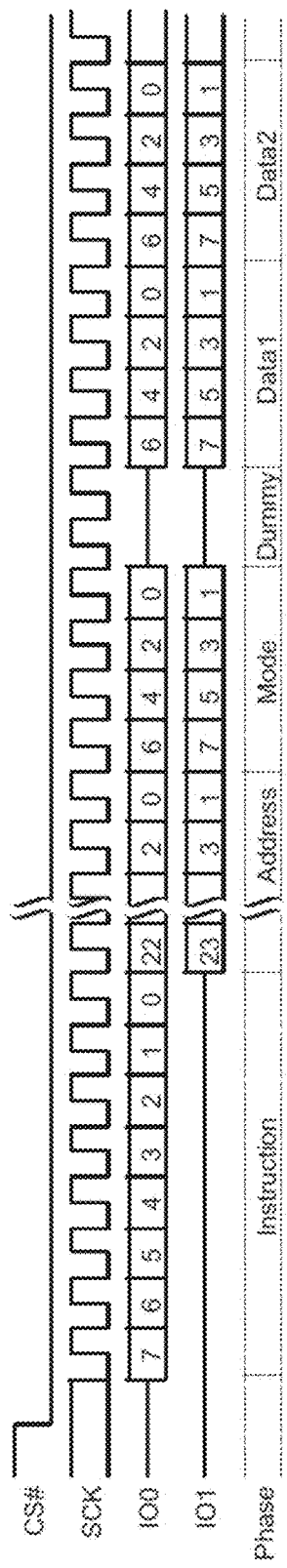
FIG. 5 is a waveform diagram of an example fast read dual I/O command sequence.
Figure 6:
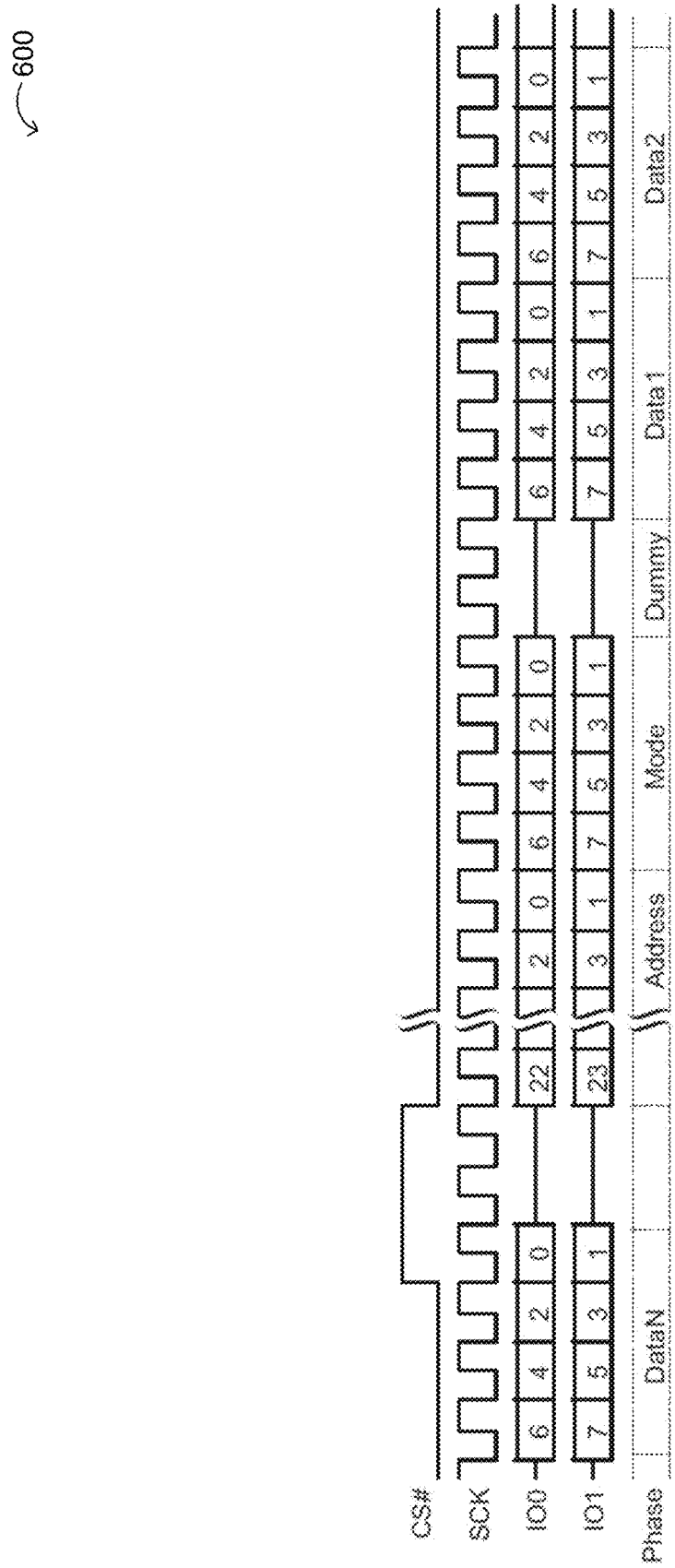
FIG. 6 is a waveform diagram of an example fast read dual I/O command sequence.
Figure 7:
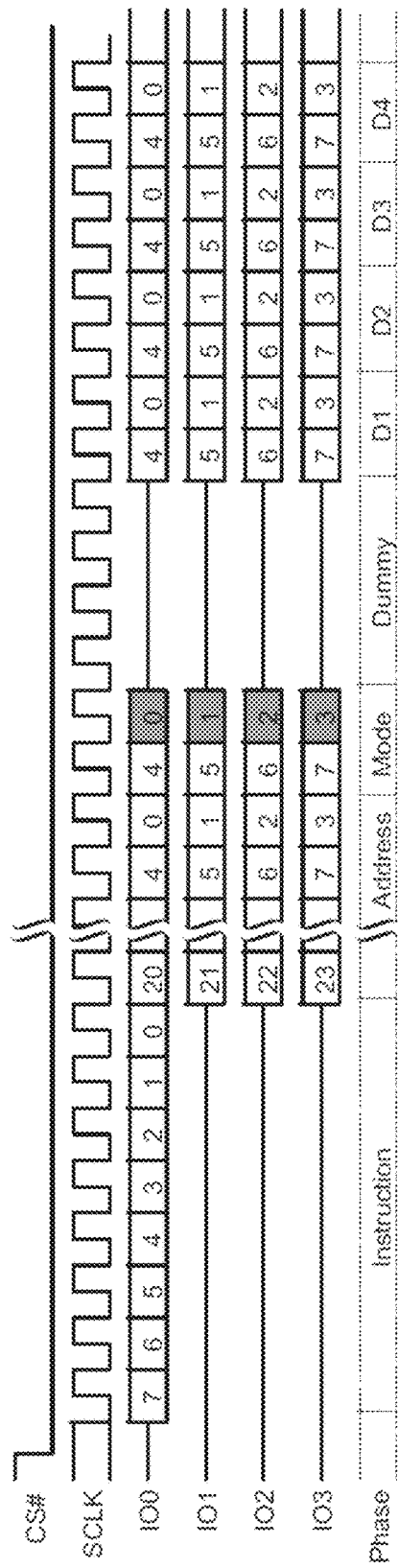
FIG. 7 is a waveform diagram of an example fast read quad I/O command sequence.
Figure 8:
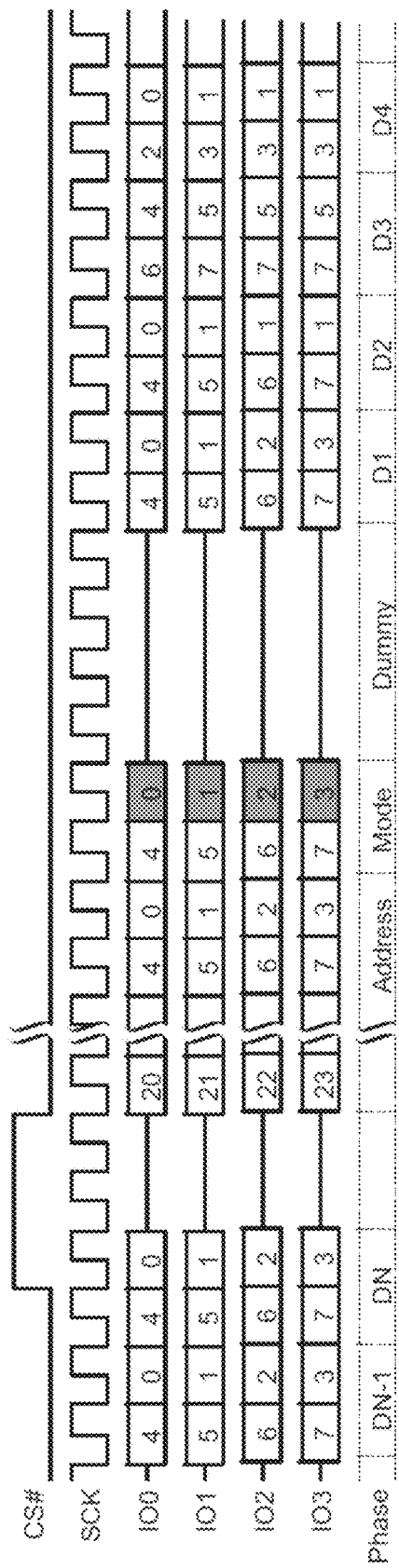
FIG. 8 is a waveform diagram of an example fast read quad I/O command sequence.

Referring now to FIGS. 2-8, shown are waveform diagrams of various standard SPI command sequences. While the examples are described with respect to an SPI type of interface, particular embodiments are suitable to other serial and/or parallel interfaces. Generally, these instructions are passed on an interface between a host (e.g., CPU) device and a memory (e.g., NVM) device. Standard SPI read commands may start with chip select (CS) going low, followed by instruction (e.g., 8-bits), address (e.g., 32-bits, 24-bits, or less), optional mode (e.g., 8-bits), N dummy bytes (e.g., each byte is 8-bits, and N may be configurable), and data (e.g., multiple 8-bit bytes). FIG. 2 shows a waveform diagram 200 of an example fast read command sequence, FIG. 3 shows a waveform diagram 300 of an example fast read dual output command sequence, and FIG. 4 shows a waveform diagram 400 of an example fast read quad output command sequence. The mode bits may specify a continuous read mode, and in that case, the next command may be implied to also be a read, thus potentially saving 8-bits of overhead by not having to send the instruction bits.

FIGS. 5-8 show waveform diagrams (500, 600, 700, and 800) of example fast read dual I/O command sequences that may include the mode byte. It should be noted that the diagrams in FIGS. 2-8 generally follow an "X-X-X" nomenclature whereby the first X specifies how many I/O lines may be used for the command, the second X specifies the number of I/O lines that may be used for the address, and the third X specifies the number of I/O lines used for data. Along these lines, FIGS. 2, 3 and 4 respectively show 1-1-1, 1-1-2, and 1-1-4 read operations, while FIGS. 5-8 respectively show 1-2-2, 2-2-2, 1-4-4, and 4-4-4 read operations with a mode byte. Note that there are also SPI systems that operate in 1-1-8, 1-8-8, and 8-8-8 arrangements, and that particular embodiments are suitable for any SPI or other interface arrangements or protocols.

Figure 9:
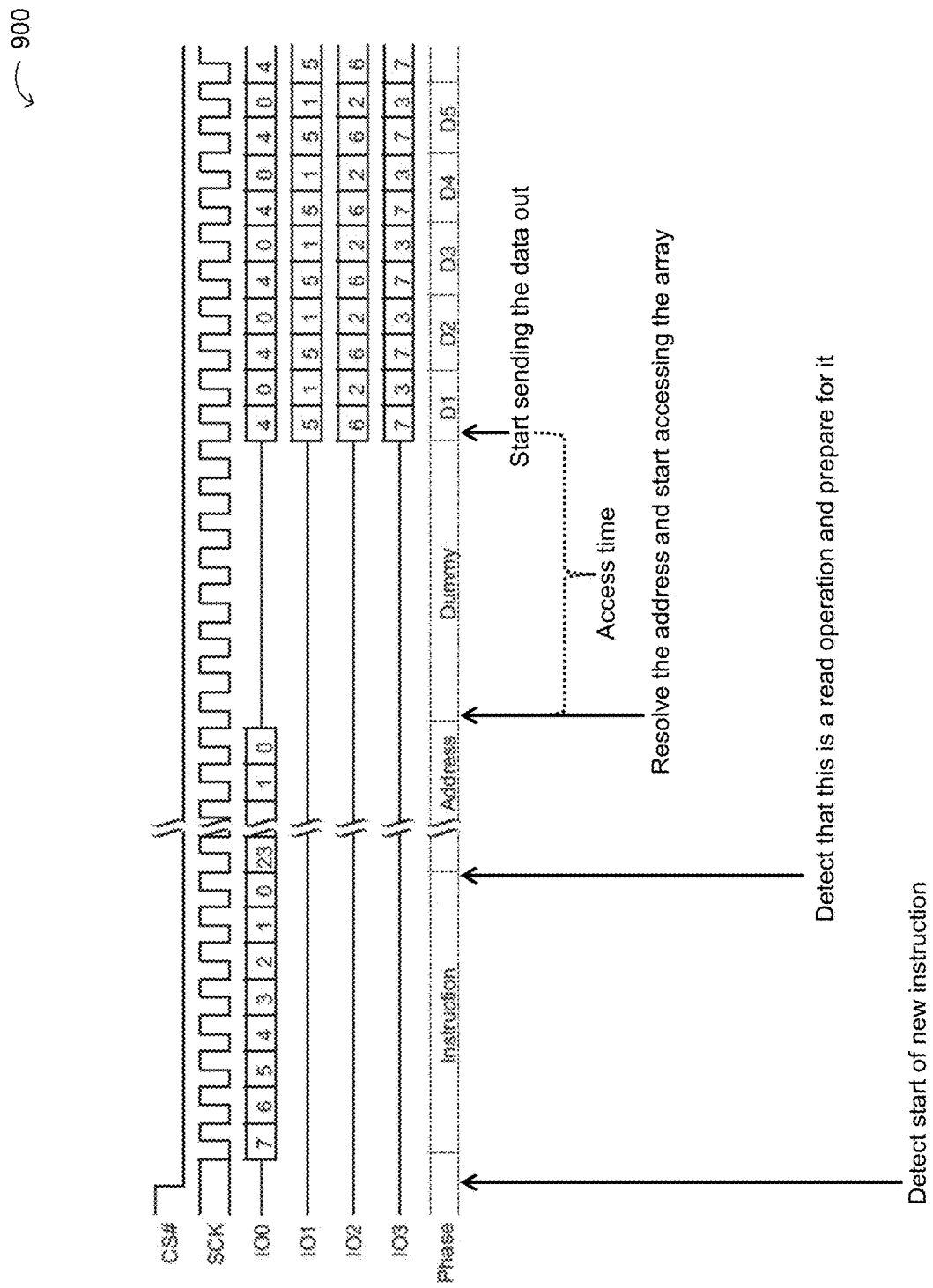
FIG. 9 is a waveform diagram of an example flash internal operation.

Referring now to FIG. 9, shown is a waveform diagram 900 of an example flash internal operation. In this example, SPI commands and data are provided serially on one, two, four lines (Quad SPI), or eight lines (Octal SPI). In full Quad SPI mode (e.g., a 4-4-4 mode, as described above), 4 bits may be sent (e.g., to/from an NVM) each clock cycle, and different clock frequencies may be supported. For example, the clock (SCK) may go up to about 100 MHz, up to about 120 MHz, or up to a higher frequency. Note that while diagram 900 generally shows a 1-1-4 SPI mode, a 4-4-4 mode is described as to this particular example. The timing of an SPI read command in full Quad SPI mode can include instruction (e.g., 8-bits—2 clock cycles—about 20 ns), address (e.g., 24-bits—6 clock cycles—about 60 ns), mode (e.g., 8-bits—1 clock cycle—about 10 ns), N dummy bytes (e.g., each byte is 8-bits, N may be configurable—2×N clock cycles—about N×2×10 ns), and data (e.g., multiple 8-bit bytes). The NVM can start preparing for a read operation after decoding the instruction, and actual data access can start after the address has been received. Also, the access time can be 1+N cycles (e.g., one for the mode byte, and N for the dummy bytes).

In particular embodiments, while the NVM device is performing/executing a write operation, the NVM device can detect incoming read operations, and may perform at least a reconfiguration (e.g., suspend, slow down, etc.) of the write operation in order to ensure that the incoming read operation can be processed. The write operation can resume and/or return to normal write operation when the read operation is over, or is at least partially executed and far enough along so as to not be disturbed by noise related to the write operation. Available timing for performing a reconfigured write can be limited in full Quad SPI mode. Thus, transitioning into a reconfigured write can start immediately after a read command is detected, and the NVM may be in reconfigured write before the read access starts. In this case, only 6 clock cycles may remain to perform the reconfigured write. In some cases, the NVM device can start the transition 2 cycles earlier (e.g., immediately after detecting CS going low), but this can cause write reconfiguration even if the detected command was not a read command (e.g., a command that polls the NVM status).

Figure 10:
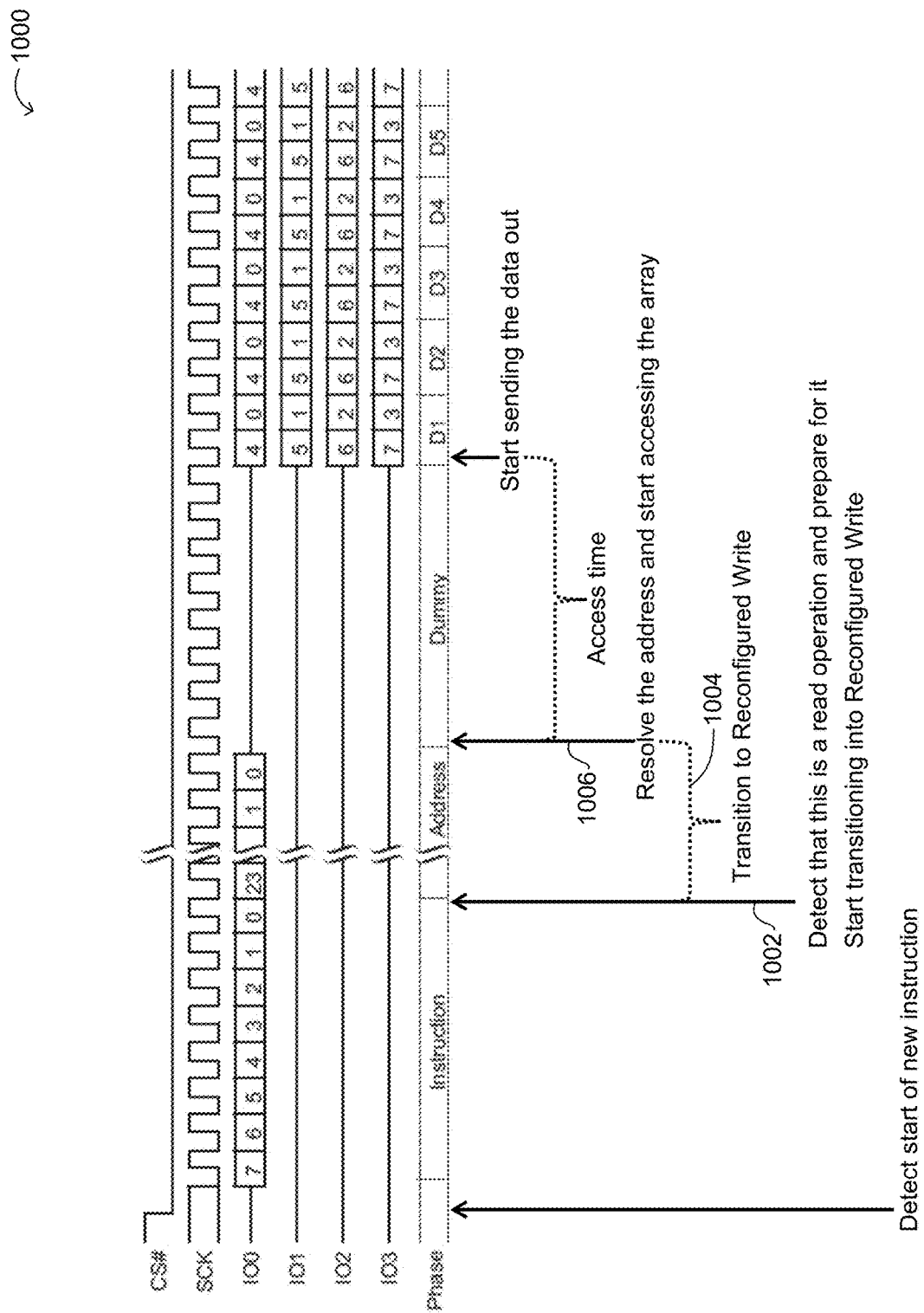
FIG. 10 is a waveform diagram of an example transition to reconfigured write, in accordance with embodiments of the present invention.

Referring now to FIG. 10, shown is a waveform diagram 1000 of an example transition to reconfigured write, in accordance with embodiments of the present invention. If a write operation is ongoing, the new command can be detected at 1002 as a read command. In response to detection of the read operation, a transition to a reconfigured write can occur over a time portion as shown at 1004. Thus, at 1006 at the end of transition time portion 1004, the write operation can effectively be reconfigured (e.g., timing adjusted, write configuration parameters changed, etc.), and the read access can occur as part of execution of the read command. After the access time has elapsed, data can begin to be output from the NVM in a serial fashion, as shown. As will be discussed in more detail below, reconfiguring of the write operation can include such adjustments so as to minimize noise or other possible interferences with proper execution of the read operation.

Figure 11:
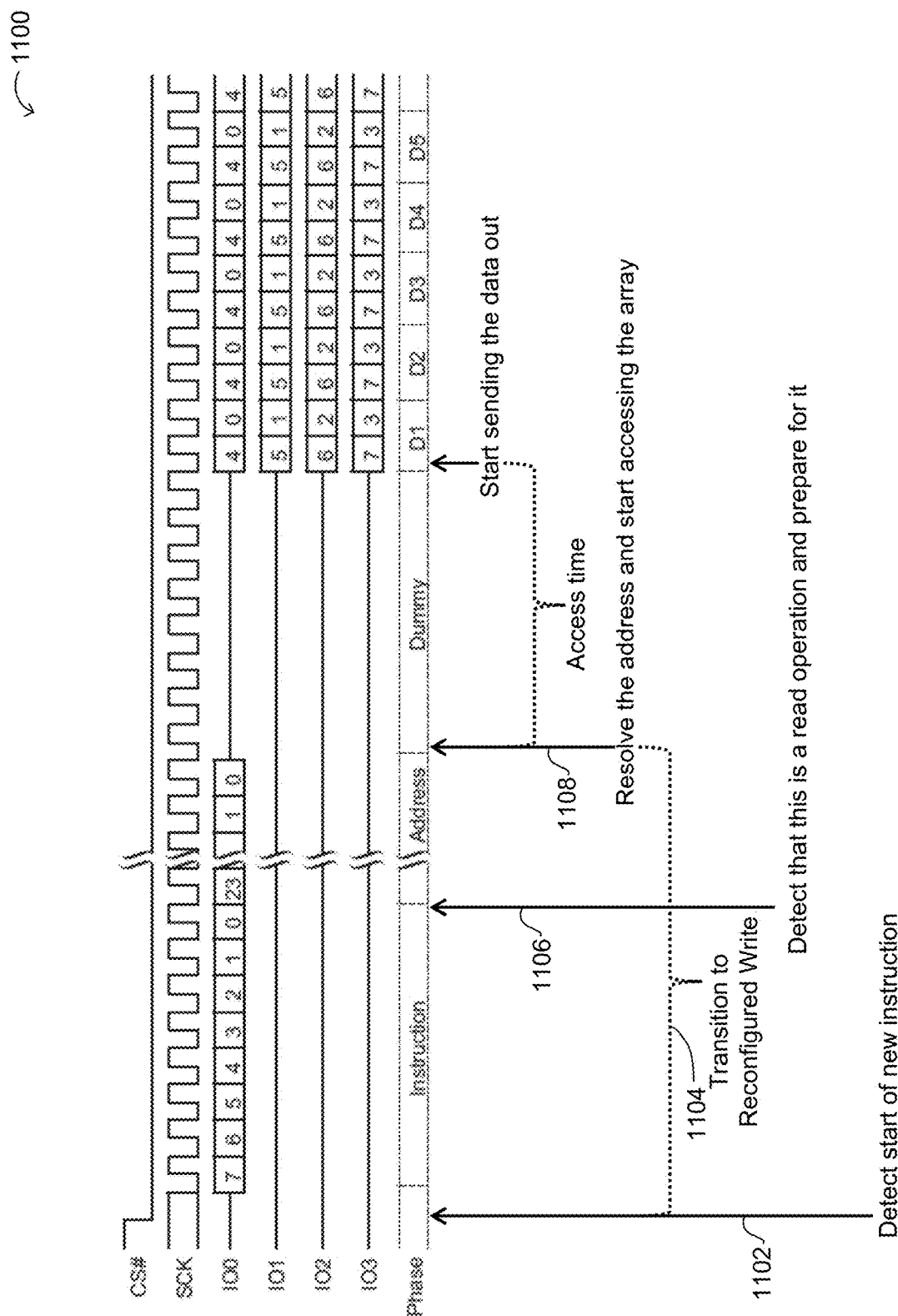
FIG. 11 is a waveform diagram of an example alternative transition to reconfigured write, in accordance with embodiments of the present invention.

Referring now to FIG. 11, shown is a waveform diagram 1100 of an example alternative transition to reconfigured write, in accordance with embodiments of the present invention. In this particular example, a start of a new instruction can be detected at 1102. At this point, the memory device does not know whether this new instruction is a read operation, or some other type of operation. However, the new operation can be taken or presumed as a read operation for purposes of transitioning to a reconfiguration of an ongoing write operation, as shown by time portion 1104. Thus, new commands can be speculatively taken as read commands in order to start the transition into a reconfigured write sooner. For example, more time can be allowed for a smoother transition to a standby state on regulators and/or pump circuitry, or for clock speed (e.g., reduced) adjustment that is related to the reconfiguration of the write operation. If at 1106, the new instruction is detected as a read command, the reconfigured write can be farther along, and the access of the memory array can begin at 1108. If however, the new instruction is some other type of command, then execution of the write operation can return to its normal settings/configurations.

Figure 12:
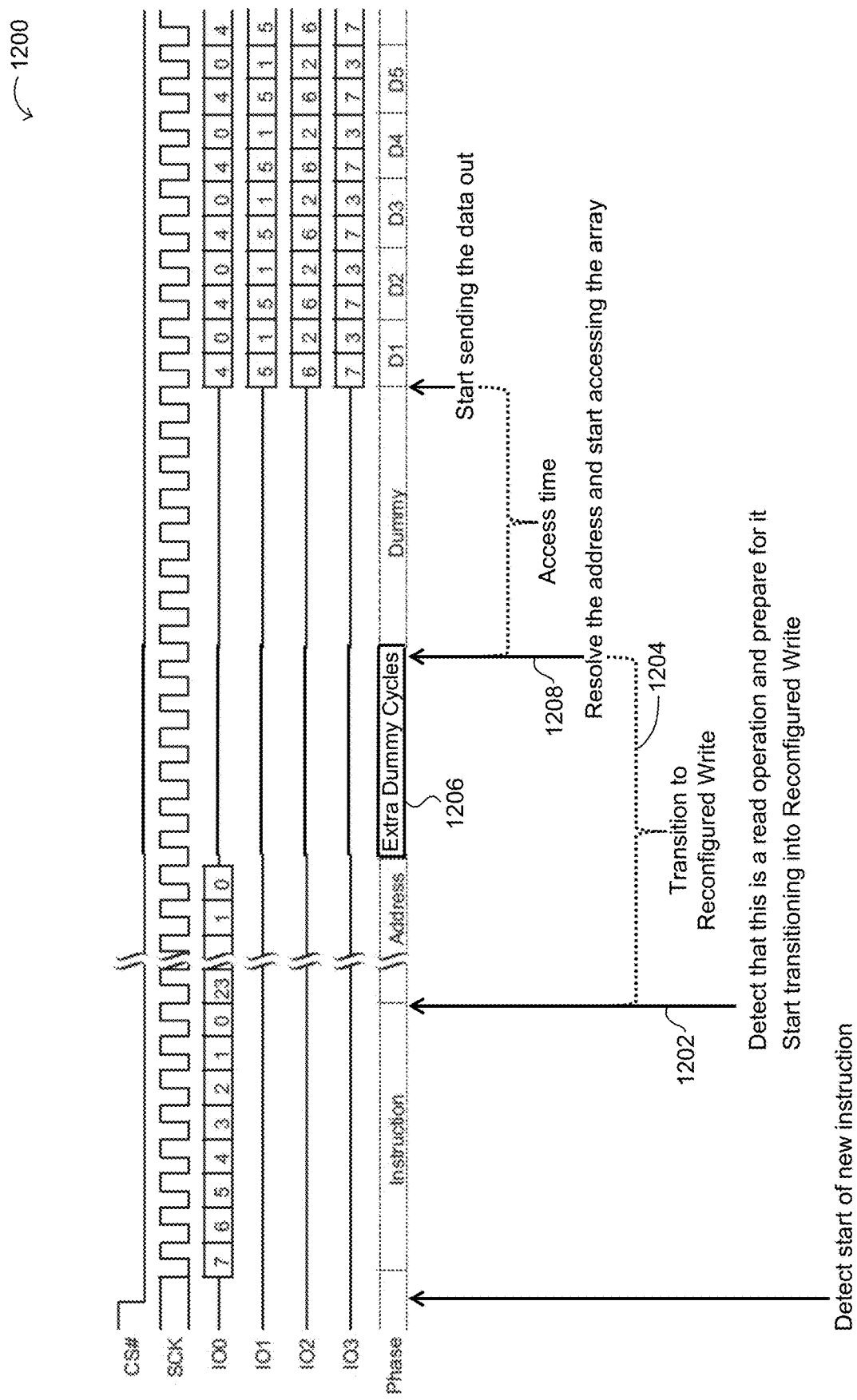
FIG. 12 is a waveform diagram of an example alternative transition to reconfigured write with additional dummy cycles, in accordance with embodiments of the present invention.

Referring now to FIG. 12, shown is a waveform diagram 1200 of an example alternative transition to reconfigured write with additional dummy cycles, in accordance with embodiments of the present invention. In this case, the time allowed for transitioning into a reconfigured write may be increased by adding extra dummy cycles. Here, once the instruction has been provided while the write operation is ongoing, the new instruction can be detected as a read command at 1202. In response, a transition to reconfigured write can occur during time portion 1404. As part of this transition, extra dummy cycles 1206 can be added in order to allow more time to accommodate the reconfigured write transition. For example, this extra time may be utilized for capturing the state of the write operation prior to reconfiguration, and/or transitioning pump/regulators into lower current mode, standby or quiescent states as part of the reconfigured write operation. At 1208, the read cycle can begin, with data beginning to come out after the access time has elapsed.

In addition, continuous read mode read operations may have even tighter timing constraints because these operations may each be at least 1 cycle shorter (in full Octal mode, e.g., 8-8-8), as compared to a standalone read operation. Thus, in some cases, the write operation may remain reconfigured (e.g., slowed down, paused/suspended, etc.) for as long as the NVM is in the continuous read mode. The write operation can then resume and/or return to its normal operation/configuration once the continuous read mode has ended. Also, the status register can include a progress counter to measure progress in completing the write operation, such as by counting how many bytes have been written, by counting a number of write pulses, and/or by counting a number of write sub-operations. For example, the host processor can reduce the frequency of read accesses to the NVM device, or take other appropriate action, if the progress counter indicates relatively slow progress in completing the write operation (e.g., due to repeated write suspensions or slow-downs as a result of interrupting read operations). In other cases, the NVM can immediately start the transition to a reconfigured write in a continuous read mode when active low signal CS transitioning low is detected, such as shown in the example of FIG. 11 for a single read operation.

In certain embodiments, additional time can be provided for a reconfigured write transition by adding dummy cycles and/or by stopping the clock for a predetermined number of cycles as part of, or associated with, the read commands. However, adding such cycles to every read operation may reduce the read throughput of the NVM device. Alternatively, a new read command, a "slow read" command, can be added and may include such extra dummy cycles as part of the associated command sequence. For example, such a slow read command may only be used when the NVM is in a write mode, while standard read commands can otherwise be issued when appropriate. In this way, the performance impact of the additional dummy cycles can be reduced. For implementation, the SPI controller on the host device can be changed such that before the CPU/host initiates a write command, the state can be changed to use slow read commands instead of the standard read commands. When the CPU or SPI controller detects that the write operation is completed (e.g., by checking the NVM status), the SPI controller can be placed in a normal mode in which the host again uses standard read commands instead of slow read commands.

Figure 13:
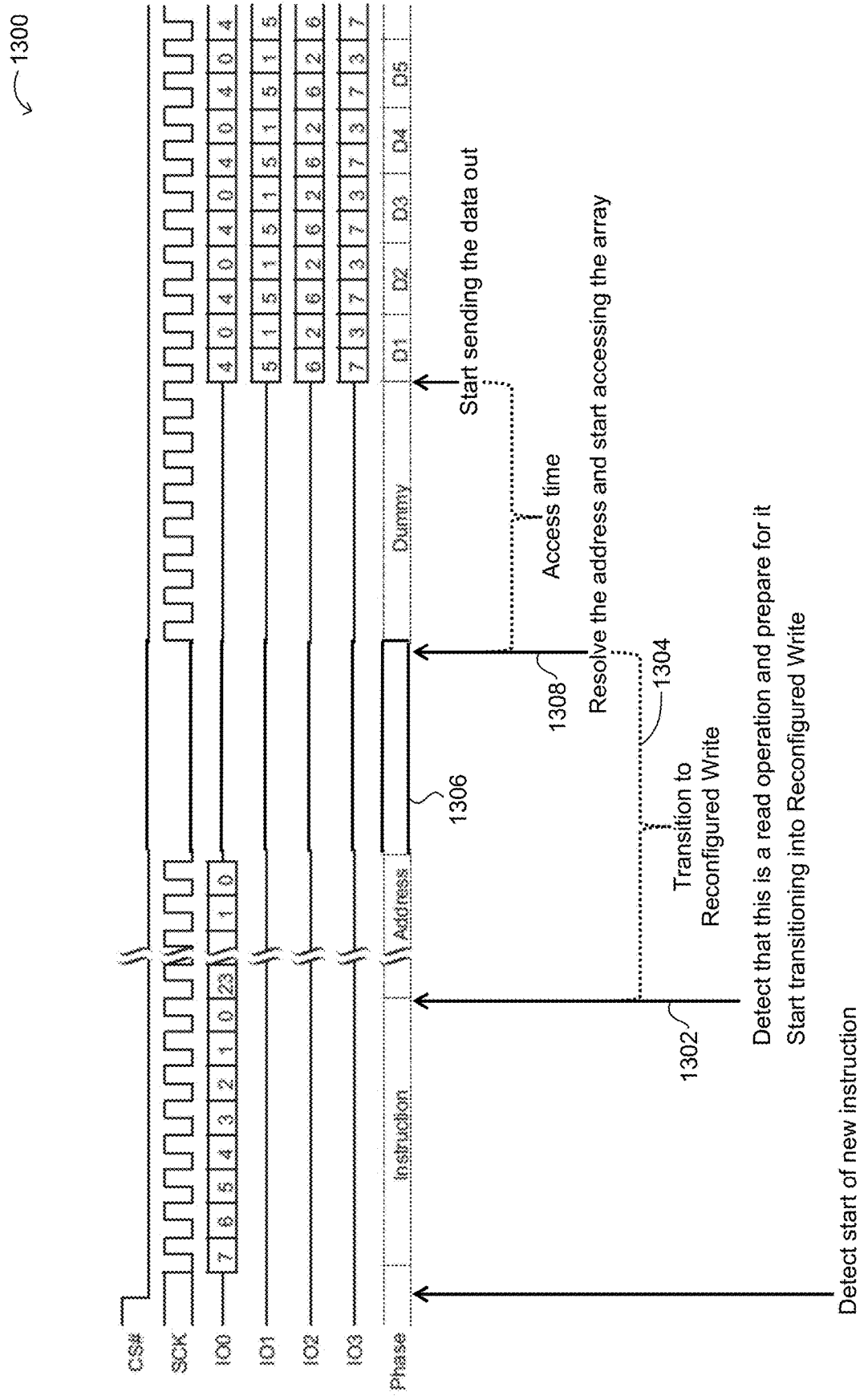
FIG. 13 is a waveform diagram of an example alternative transition to reconfigured write with clock stoppage, in accordance with embodiments of the present invention.

Referring now to FIG. 13, shown is a waveform diagram 1300 of an example alternative transition to reconfigured write with clock stoppage, in accordance with embodiments of the present invention. In this case, the time for transitioning into a reconfigured write may be increased by stopping or suspending the clock for a number of cycles. Here, once an instruction has been provided while the write operation is ongoing, the new operation can be detected as a read operation at 1302. In response to detection of a read command, a transition to reconfigured write can occur during time portion 1304. As part of this transition, the clock on the interface can be suspended during time portion 1306 in order to allow for more time to accommodate the reconfigured write transition. At 1308, the read cycle can begin, with data beginning to come out after the access time has elapsed.

In another case, the falling edge of the CS signal can be detected, and may be used to trigger the memory controller state machine, such as in the example of FIG. 11. However, only using a 1-to-0 transition of CS (active low) to trigger the write reconfiguration action may cause SPI commands that are not read commands to also cause such reconfiguration. This can result in a larger latency for the write operation when the memory device reconfigures on non-read commands. In another implementation, the memory controller state machine can be triggered after waiting until the read command is actually decoded (e.g., at 1302 of FIG. 13). In this way, unnecessary pauses or reconfigurations can be substantially eliminated by using the SPI command decoder in the NVM to determine essentially when to request a write reconfiguration as described herein.

The following sections describe various implementation examples for NVM devices, including CBRAM-based devices and/or flash-based devices. For example, a CBRAM-based architecture and cell functionality can be utilized with a memory controller state machine implementation or other NVM-based controller in order to implement write operation reconfigurations (e.g., pauses/suspensions), as described herein. Further, any other volatile memory or NVM devices, such as flash-based devices, including those with serial interfaces, and in some cases parallel interfaces, can also be employed in particular embodiments.

Figure 14:
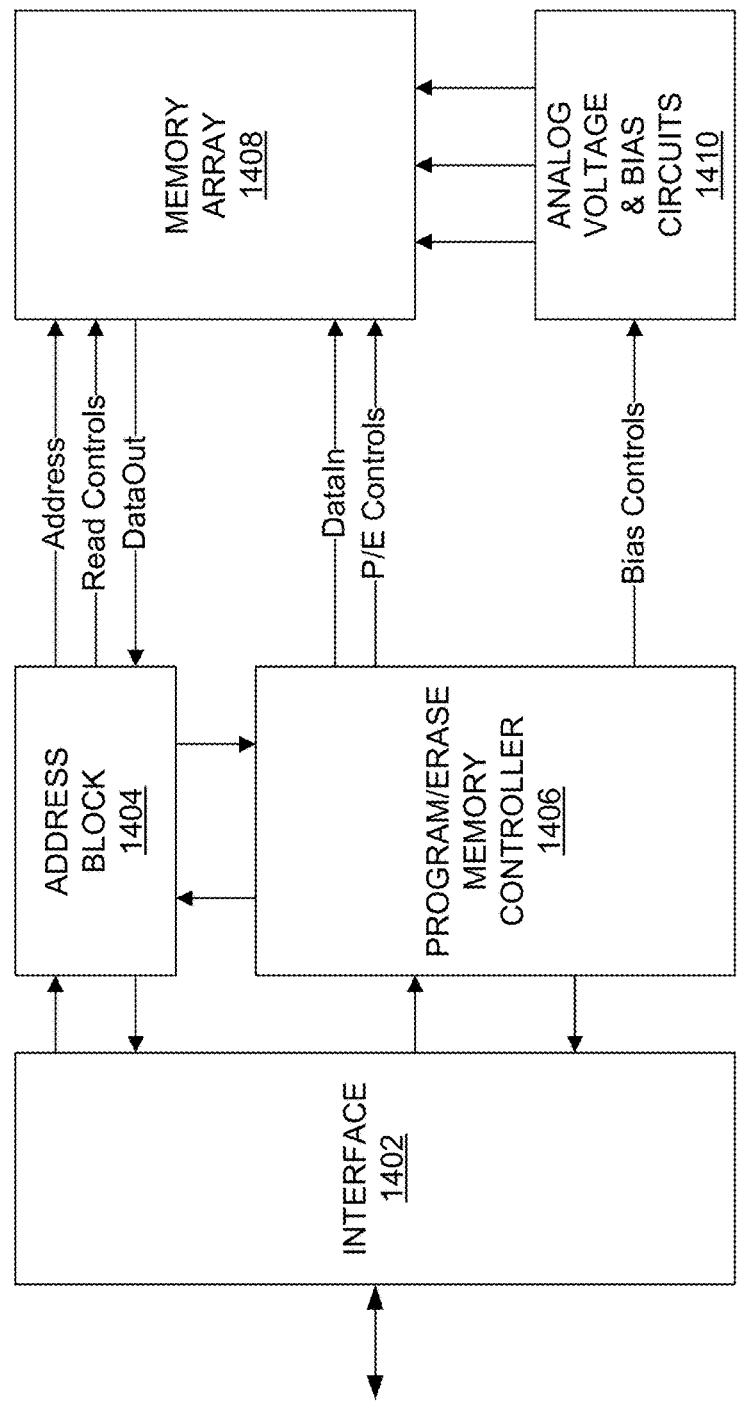
FIG. 14 is a schematic block diagram of an example architecture without support for concurrent read and write operations.

Referring now to FIG. 14, shown is a schematic block diagram of an example architecture 1400 without support for concurrent read and write operations. Architecture 1400 can include interface 1402, such as an SPI interface, that may receive commands from, and communicate with, a host processor. Interface 1402 (e.g., a bus interface) can pass address information to address block 1404, and program/erase operation control information to memory controller 1406. Address block 1404 can perform address decoding for accessing memory array 1608. Here, address block 1404 may be shared between read and program/erase operations and controls. Also, memory array 1408 may have a single address bus that is shared between read and program/erase operations. Program/erase controller 1406 can also send bias controls to voltage and bias circuitry 1410, such as for generating the appropriate bias levels for program and erase operations on memory array 1408.

Figure 15:
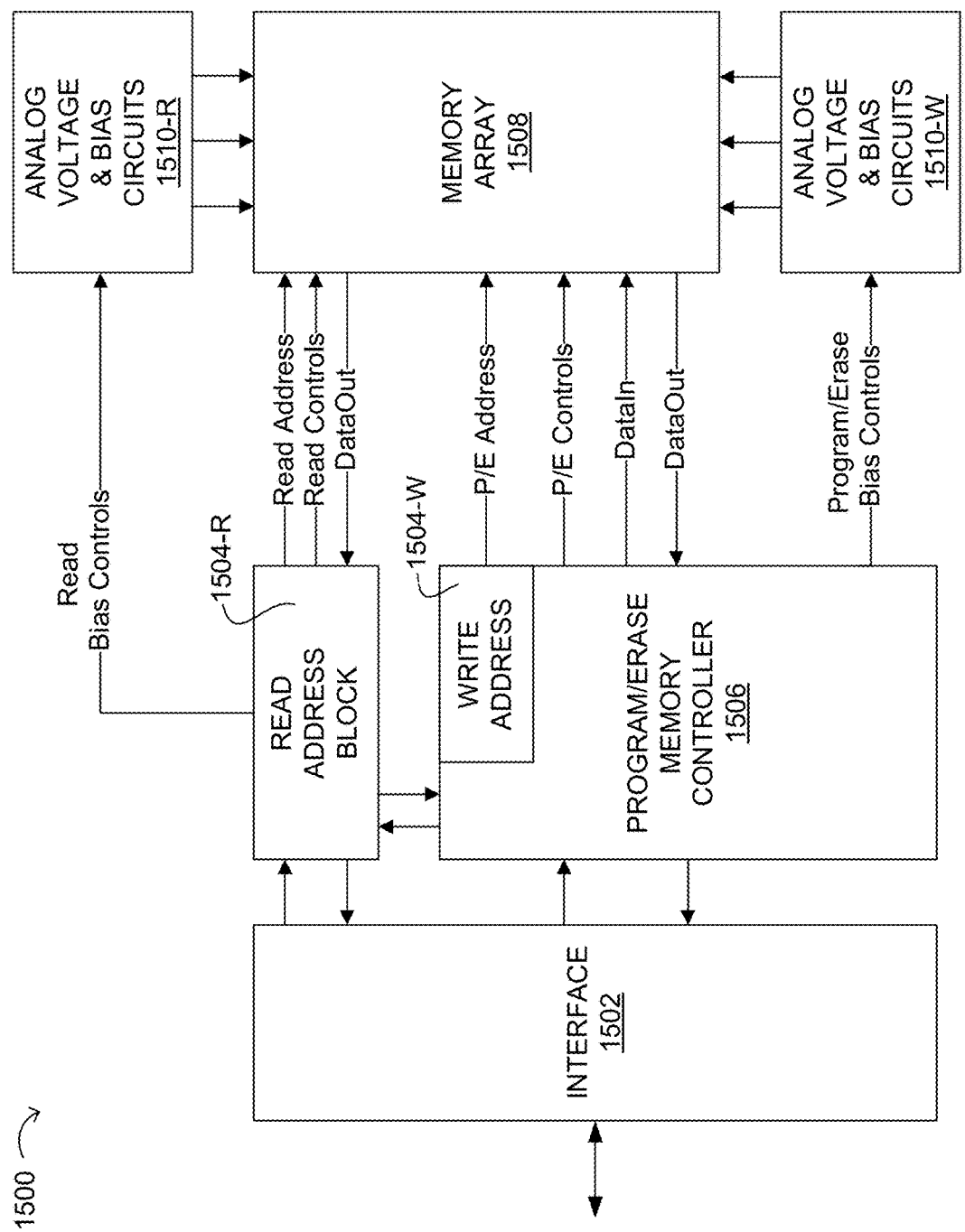
FIG. 15 is a schematic block diagram of an example architecture with concurrent read and reconfigured write support, in accordance with embodiments of the present invention.

Referring now to FIG. 15, shown is a schematic block diagram of an example architecture 1500 with support for concurrent read and write operations, in accordance with embodiments of the present invention. NVM device architecture 1500 can include interface 1502 (e.g., an SPI interface) for communication with a host processor or other device. Interface 1502 can pass address information to read address block 1504-R, and program/erase operation control information to memory controller 1506. In this case, the read, program/erase address, control, and bias buses may be separated in going to memory array 1508 and voltage/bias circuitry 1510. For example, memory array 1508 may have dedicated address buses for read operations (e.g., from read address block 1504-R) and write operations (e.g., from write address block 1504-W). This can allow program/erase memory controller 1506 to reconfigure the write (program/erase) operation on a first array block (e.g., doing nothing, slowing, or freezing the program/erase control signals and/or address buses) in memory array 1508, while using the read control and address bus to read data from a second array block in memory array 1508. The program/erase operation can then be resumed or otherwise returned to normal on the first array block after the read operation from the second array block in memory array 1508 is completed, or far enough along and at least partially completed.

Program/erase controller 1506 can also send bias controls to voltage and bias circuitry 1510, such as for generating the appropriate bias levels for program, erase, and read operations on memory array 1508. For example, voltage and bias circuitry 1510 can be separated into bias circuitry 1510-R receiving read bias controls, and bias circuitry 1510-W receiving program/erase bias controls. In this way, the biases (e.g., voltage and/or current biases) on the program/erase selected block can be reconfigured or adjusted (e.g., the program/erase bias control signals may put the associated bias circuitry in standby) during the reconfigured write, while the read operation is being executed. For example, the charge pumps used to generate high-voltage biases (e.g., for program/erase operations) can be pumped at a lower frequency or standby rate (or any other reconfigured control or rate) in order to maintain the levels during the reconfigured write time period because there may be no substantial current draw on these voltage supplies due to the write operation reconfiguration (e.g., slow down, suspension, etc.).

Once the read operation has completed and the write operation is to be resumed or otherwise returned to normal write operation, the program/erase controls can be activated to resume the write operation. In addition, the program-and erase bias controls can be activated to return to normal write operation bias control, including active pumping of high-voltage charge pumps, or other forms of active voltage regulation. Because in some cases the program/erase biases may be held at a standby level, or at substantially the same active level, time and power can be saved in allowing such biases to settle to the correct levels as part of the returned/resumed write operation. Analog voltage and bias circuitry 1510-W can also be utilized to "weaken" a write operation as part of a reconfigured write operation. For example, program/erase bias controls can indicate that the memory device is in a reconfigured write operation, and as a result the write (e.g., program/erase) voltages can be lowered (e.g., via bias circuitry 1510-W) instead of being maintained at a bias level that is substantially the same as that of the active or normal write operation.

Figure 16:
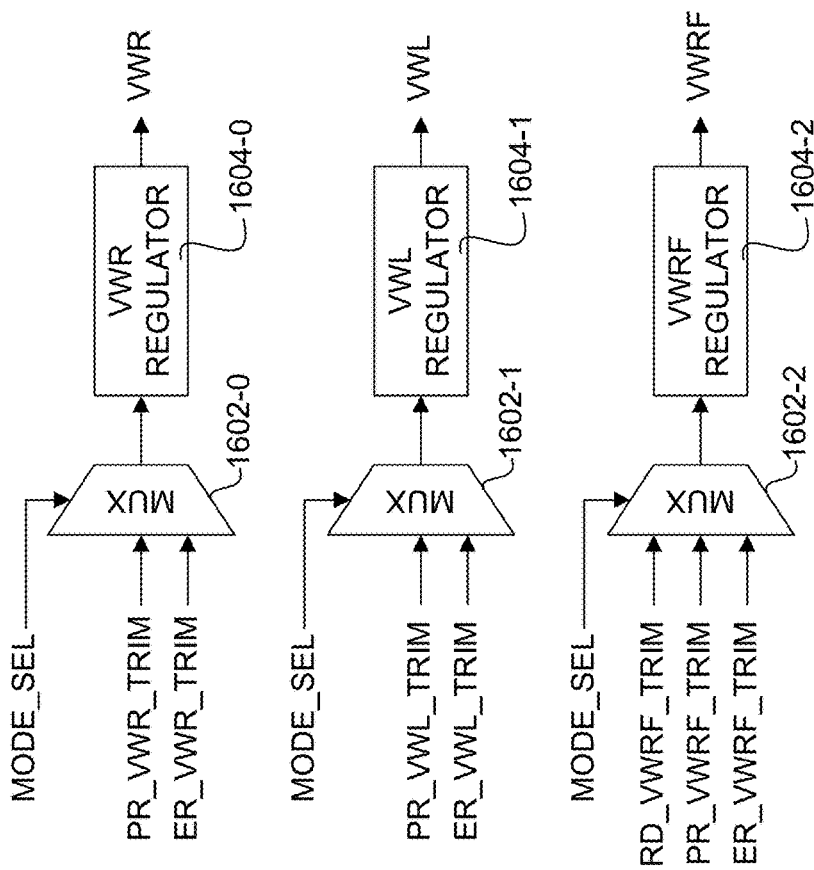
FIG. 16 is a schematic block diagram of an example regulator structure, in accordance with embodiments of the present invention.

Referring now to FIG. 16, shown is a schematic block diagram of an example regulator structure that supports reconfigured write operations, in accordance with embodiments of the present invention. For example, regulator structure 1600 can be included in analog voltage and bias circuits 1510-R and/or 1510-W. In this particular arrangement, the VWR (write voltage for right plane) and VWL (write voltage for left plane) regulators may be used only for program/erase operations, while the VWRF (write voltage/read voltage) regulator can be used for both read and program/erase operations. As will be discussed in more detail below, memory array 1508 can be arranged into two blocks or planes, such as where a write operation to the left array plane can be reconfigured in order to accommodate a read operation from the right array plane, or vice versa.

As shown, mode selection signals (e.g., derived from a command decoder) can be used to select the proper erase, program, or read operation bias voltage trim control signals for the given regulators. Trim control signals for the right array plane (e.g., PR_VWR_TRIM and ER_VWR_TRIM) can be selected via multiplexer 1602-0 based on mode selection signals, and provided to VWR regulator 1604-0 to generate bias voltage VWR. Similarly, trim control signals for the left array plane (e.g., PR_VWL_TRIM and ER_VWL_TRIM) can be selected via multiplexer 1602-1 based on mode selection signals, and provided to VWL regulator 1604-1 to generate bias voltage VWL. Also, trim control signals (e.g., RD_VWRF_TRIM, PR_VWRF_TRIM, and ER_VWRF_TRIM) can be selected via multiplexer 1602-2 based on mode selection signals, and provided to VWRF regulator 1604-2 to generate bias voltage VWRF. VWRF regulator 1604-2 can be modified in order to switch voltages in time for a transition from a program/erase operation to a read operation, such as when a reconfigured write is applied to the write operation. In some cases where this transition time is insufficient, two VWRF regulators can be included, whereby one is dedicated for program/erase operations, and the other is dedicated for read operations.

Figure 17:
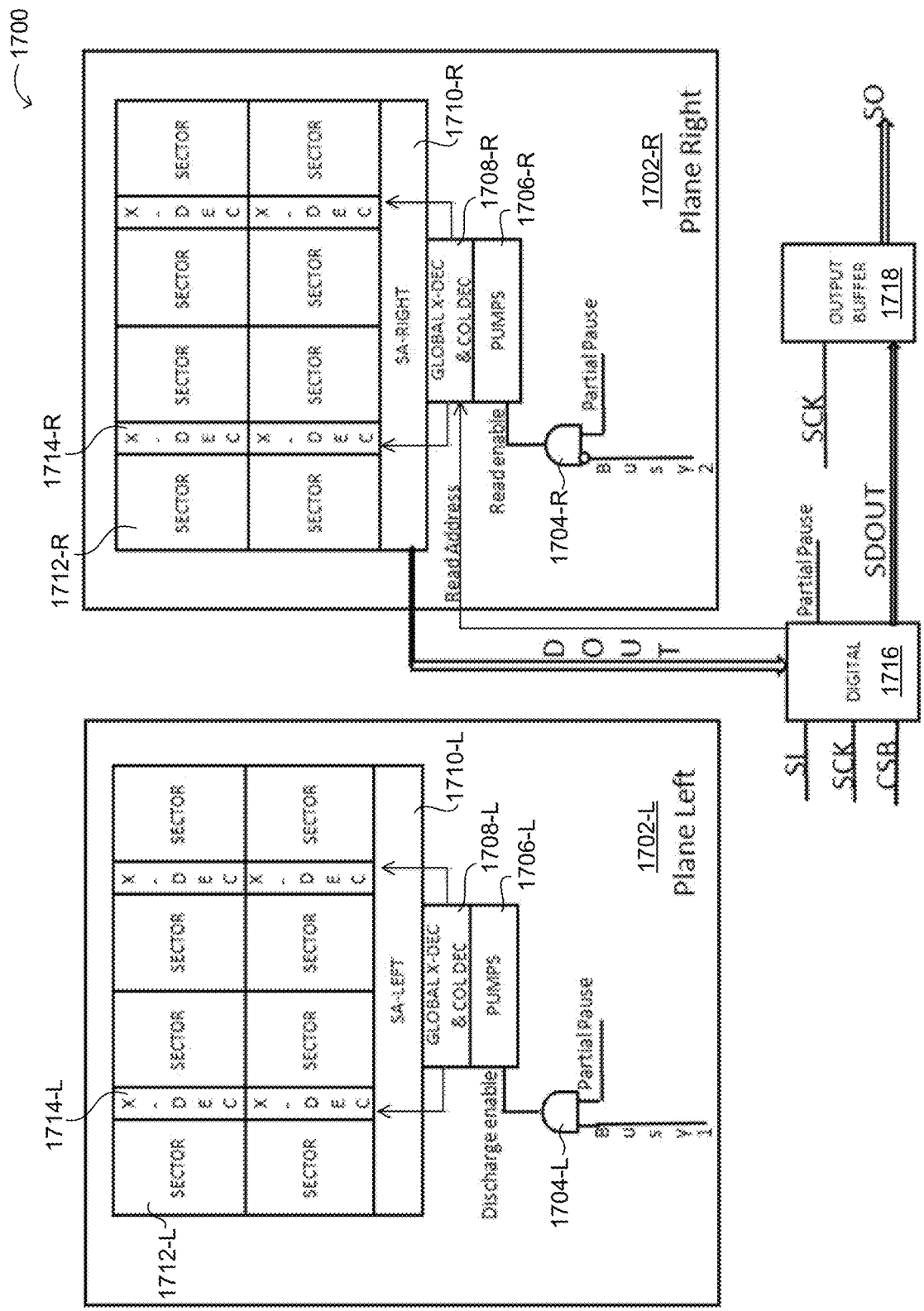
FIG. 17 is a schematic block diagram of a first example flash memory device with a concurrent read structure, in accordance with embodiments of the present invention.

Referring now to FIG. 17, shown is a schematic block diagram 1700 of a first example flash memory device with a concurrent read structure, in accordance with embodiments of the present invention. Memory array 1508 can be organized as two separate blocks or planes, whereby a write operation that occurs in one of the planes can be concurrent with (e.g., when there are no modifications to the write operation) or interrupted (e.g., when the write operation is modified as part of the reconfiguration) by a read operation to the other plane. In this particular example, plane 1702-L may have a write operation that is reconfigured (e.g., slowed down, partially paused, etc.) in response to detection of a read command directed to plane 1702-R. Thus, read out control and data circuitry can include digital logic 1716 that can receive data output from array plane 1702-R, and may be output from the memory device via output buffer 1708.

Any suitable size and structure of the division of the array portions into array planes/zones, as well as any number of planes/zones, as described herein can be supported in particular embodiments. For example, one or more registers can be employed to indicate whether a given sector or block of array sub-arrays or sectors 1712 is to be included in one plane (e.g., 1702-L) or another plane (e.g., 1702-R), such as from a total of N (e.g., 2, 3, 4, etc.) planes, as may also be specified in the register(s). In some cases, default values can be employed in such array plane configuration registers such that the registered need not be programmed in each case. In this example, memory array 1508 can be divided into two planes of equal sizes (e.g., 8 sectors each); however, in other cases the two planes can be of different or unequal sizes and/or ratios (e.g., 1/16, 1/8, 1/4, etc.), and/or more than two planes can be configured. Example array plane 1702-L can include logic circuit 1704-L, which may provide a state control or enable signal to pumps 1706-L. In certain embodiments, the pump and/or write circuitry can be modified (e.g., standby, discharge, slowdown, speedup, quiescent, or even no adjustments, etc.) independently in each plane 1702. For example, pumps 1706-L (e.g., including regulators 1604) can be placed into such modified (e.g., discharge or standby/quiescent state control) in response to activation of the reconfigured write control signal, such as when a write operation to array plane 1702-L is interrupted by a read operation to array plane 1702-R.

Array plane 1702-L can also include global X-decoders and column decoders 1708-L, sense amplifiers 1710-L, memory cell sectors or sub-array blocks 1712-L, and local X-decoders 1714-L. Similarly, array plane 1702-R can include logic circuit 1704-R, which may provide a read enable signal to pumps 1706-R. For example, pumps 1706-R (e.g., including regulators 1604) can be activated for a read operation in response to the read enable control signal, such as when a write operation to array plane 1702-L is interrupted by a read command directed to array plane 1702-R. Array plane 1702-R can also include global X-decoders and column decoders 1708-R, sense amplifiers 1710-R, memory cell sectors or sub-array blocks 1712-R, and local X-decoders 1714-R.

Reconfigured write control implementation can include a finite state machine (FSM), and in particular may include digital logic configured to control the operating state of the memory device according to the FSM. If the FSM is already in an idle state, then the trigger to indicate that a write operation is to be reconfigured may have no effect. However, if the state machine is in an active state, then the reconfiguration/concurrent trigger can cause registers and logic controlling the write speed, algorithm, and/or strength, etc., to be modified in some cases as part of the reconfigured write operation. In addition, none (e.g., in cases of no write operation modifications), or one or more options (e.g., speed, algorithm, strength, etc.) for the write configuration or reconfiguration can be programmed in advance, such as during test/characterization. For example, none, one or more registers can be employed to store information that indicates or defines the reconfigured write operation versus a standard/normal write operation.

Alternate FSMs can also be used during reconfiguration/concurrent operation. In one case, an FSM can change the control/enable lines (e.g., bias control signals) to indicate to the bias circuits (e.g., 1510) to stop current operation, to return to a quiescent or standby state, or to otherwise adjust bias levels (e.g., reduce levels to weaken the write operation during a reconfigured write). For example, this can include VWR regulator 1604-0, VWL regulator 1604-1, VWRF regulator 1604-2, and/or other bias enable signals (e.g., ENES/ENPS). In some cases, such as in CBRAM-based NVM devices, the voltages that are the slowest to return to a quiescent state can include the anode voltage during the program operation. However, because the read block (e.g., 1702-R) may physically be different from the write block (e.g., 1702-L), the write block anode voltage (e.g., via pumps 1906-L) can be allowed to slowly discharge even as sensing (e.g., via 1710-R) from the read block occurs.

If the SPI command decoder (e.g., including digital logic 1716) determines that the detected command is a read command, then the read circuits can be activated (e.g., via logic circuits 1704-R to generate a read enable signal) to sense data from the array, such as from a different block (e.g., 1702-R) than the one (e.g., 1702-L) in which a write operation is ongoing. Since the blocks or planes being read from and written to may be different, the write block biases reaching the quiescent state, modified state, or no change at all in some cases, prior to the beginning of the read block operation is less of a concern. Once the read operation is completed and the CS signal is inactive high, this low-to-high transition trigger can be used to trigger a return to a configuration of a normal write operation (e.g., fast mode, reset/reload of changed registers and logic, etc.).

This restart signaling can then use the saved registers to reload the control registers, and to return to the correct point in the FSM to continue normal operation as to the previously reconfigured write operation (e.g., in block/plane 1702-L). Depending on the particular implementation, the write operation can be stepped back to a distinct/predetermined "restart" point or state (e.g., write speed) or the write operation may gradually return to the normal write operation state. For a read operation that is in fact a write verify operation, the bit line latches in the write circuitry may remain unchanged by the read operation, and/or separate sense amplifiers can be used for the read operation, which is the case when the read operation is from a different block/plane than that of the write operation. Since in this case the bit line latches inside the write circuitry may be substantially unaffected by the read operation, resuming normal write configurations can be accommodated. In some situations, there may be an initialization time whereby the various regulators (e.g., regulators 1604) are switched on, and a predetermined time may elapse for the suitable biases (e.g., VWL) to stabilize prior to continuation of the previously reconfigured write operation.

The interface (e.g., a serial interface) can accept and decode a predetermined read command that triggers the reconfigured write operation. While the microcontroller can initiate reconfiguration of a current program or erase operation, the read state machine can start reading data from the core (e.g., plane 1702-R) and sending data to the output (e.g., via output buffer 1718). The content of internal addresses, attempt counter, and/or voltage regulation (e.g., DAC) levels, and phase can be stored, and appropriate pumps may be discharged or maintained in a quiescent/standby high-voltage output state. Some minimum time in a concurrent read operation may be included to allow time to store information and discharge or otherwise appropriately control pump/regulator operation. To avoid a case of not completing a busy (e.g., write) command if a user continuously enters and then exits a reconfigured write, a minimum program/erase pulse time for a resumed write operation may be included such that a subsequent new read command may not start until the minimum program/erase pulse time has elapsed. This minimum pulse requirement may thus specify a minimum time between two consecutive reconfigured write operations can be included, as another example. Also, digital logic can include a separate byte counter for read operations that may be shared between read and write operations.

Figure 18:
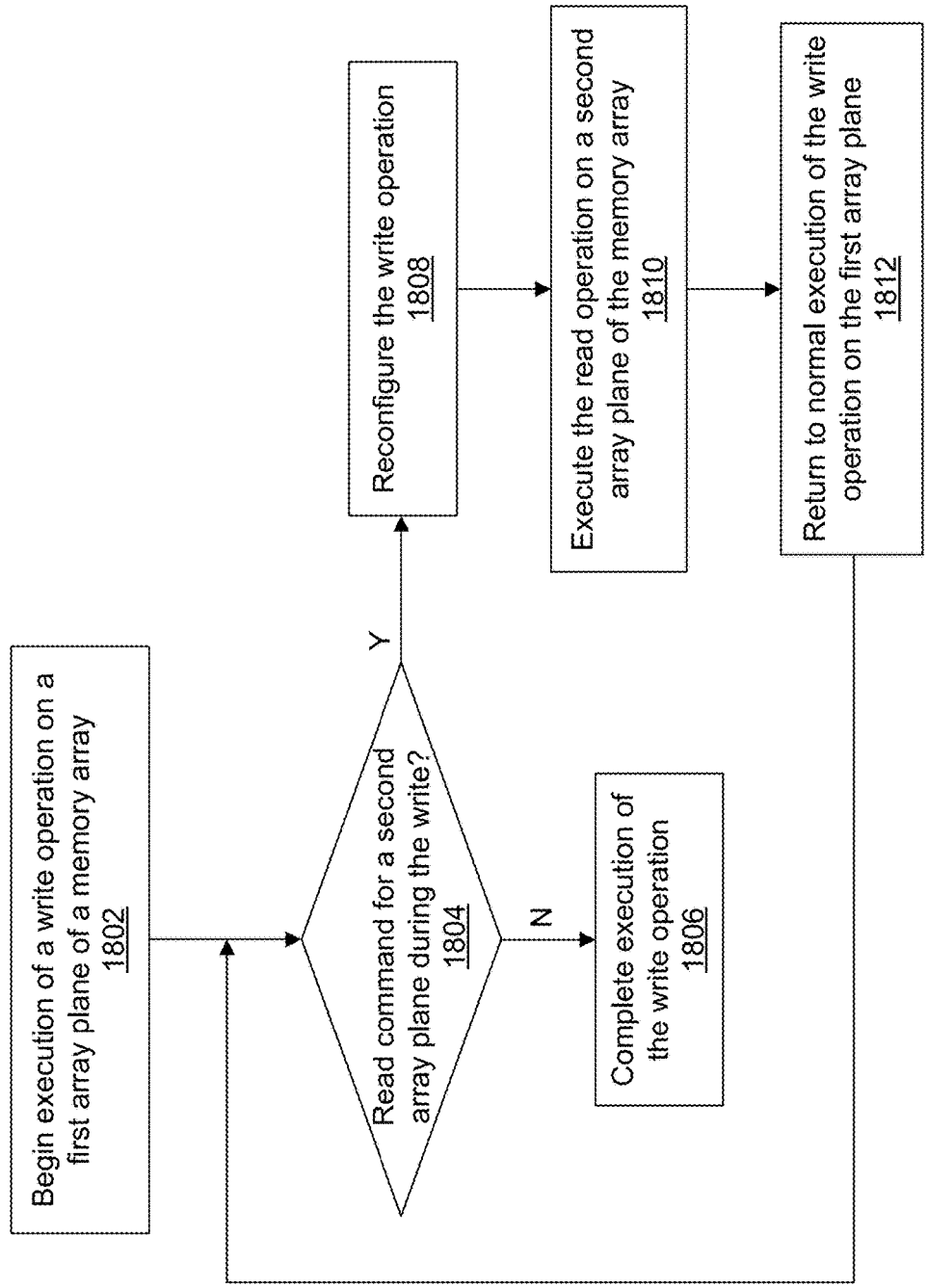
FIG. 18 is a flow diagram of a first example method of controlling a memory device with a concurrent read structure, in accordance with embodiments of the present invention.

Referring now to FIG. 18, shown is a flow diagram of a first example method 1800 of controlling a memory device with a concurrent read structure, in accordance with embodiments of the present invention. At 1802, execution of a write operation on a first array plane (e.g., of a plurality of array planes) of a memory array can begin. For example, the ongoing write operation can be in response to a previously issued write command, and the write operation can include a program or erase pulse applied to array plane 1702-L. If at 1804 there is no read command issued (e.g., for the second array plane) during execution of this write operation, then the write operation can complete at 1806. However, if at 1804 there is a read command for the second array plane that is detected during the write operation, a reconfigured write operation can begin at 1808.

As discussed above, the reconfigured write can include adjustment (e.g., reduction) of voltage regulation values, adjustment (e.g., reduction) of charge pump strength, adjustment (e.g., reduction) of oscillator frequency, and/or changing the write operation algorithm, etc., for the reconfigured write operation. At 1810, the read operation can be executed on a second array plane (e.g., 1702-R) of the memory array. Once the read operation has completed, or if the read operation is far enough along in the process so as to not be disturbed by noise due to a resumed write operation, execution of the write operation on the first array plane can be resumed at 1812. Once the write operation is returned to normal execution (e.g., with a write configuration substantially the same as the configuration prior to being reconfigured to accommodate the concurrent read) at 1812, the device can return to 1804 whereby the device may be ready for another read command (if issued), which can be detected during execution of the (now back to normal) write operation. In this way, particular embodiments can accommodate concurrent read and write operations in a non-volatile memory device, and including devices with serial interfaces.

Figure 19:
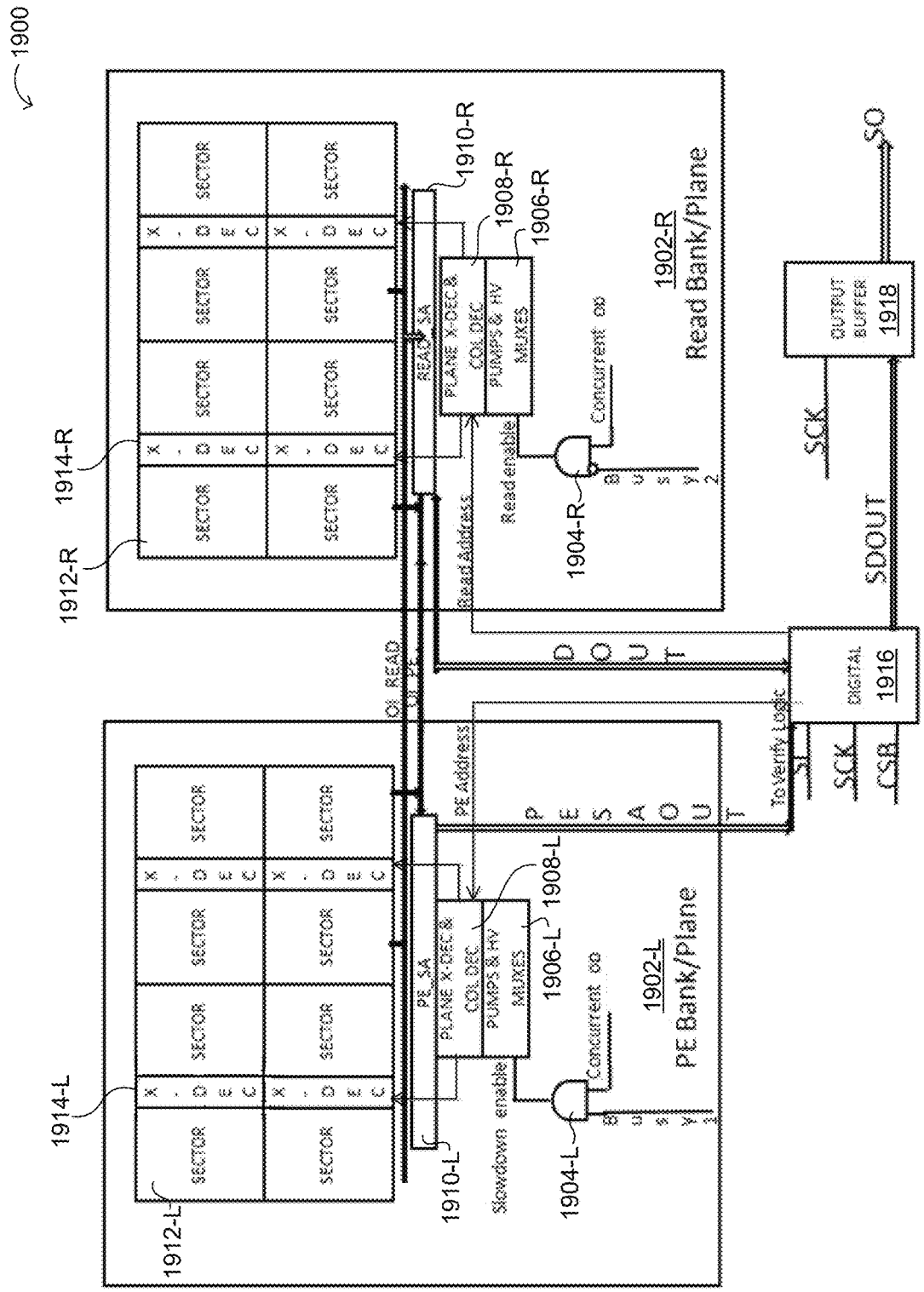
FIG. 19 is a schematic block diagram of a first example flash memory device with a concurrent read structure, in accordance with embodiments of the present invention.

Referring now to FIG. 19, shown is a schematic block diagram 1900 of a second example flash memory device with a concurrent read structure, in accordance with embodiments of the present invention. Memory array 1508 can be organized as two separate blocks or planes, whereby a write operation that occurs in one of the planes can be interrupted by a read operation to the other plane. In this particular example, plane 1902-L may have a write operation that is reconfigured in response to detection of a read command directed to plane 1902-R. Thus, read out control and data circuitry can include digital logic 1916 that can receive data output from array plane 1902-R, and may be output from the memory device via output buffer 1918.

Any suitable size and structure of the division of the array portions into array planes/zones, as well as any number of planes/zones, as described herein can be supported in particular embodiments. For example, one or more registers can be employed to indicate whether a given sector or block of array sectors 1912 is to be included in one plane (e.g., 1902-L) or another plane (e.g., 1902-R), such as from a total of N (e.g., 2, 3, 4, etc.) planes, as may also be specified in the register(s). In this example, memory array 1508 can be divided into two planes of equal sizes (e.g., 8 sectors each); however, in other cases the two planes can be of different or unequal sizes and/or ratios (e.g., 1/16, 1/8, 1/4, etc.), and/or more than two planes can be configured. Example array plane 1902-L can include logic circuit 1904-L, which may provide a bias control signal (e.g., a slowdown enable signal) to pumps 1906-L. For example, pumps 1906-L (e.g., including regulators 1604) can be placed into a reconfigured state whereby charge pump oscillator frequency is reduced, regulator output levels are reduced, and/or charge pump strength (e.g., enabled capacitance) is reduced in response to activation of the reconfigured write control signal (e.g., concurrent operation enable), such as when a write operation to array plane 1902-L is interrupted by a read operation to array plane 1902-R.

For example, two sets of sense amplifiers can be employed, such as sense amplifiers 1910-L dedicated for program/erase operations (e.g., for verify operations), and sense amplifiers 1910-R that are dedicated for read operations (e.g., bidirectional read operations such that the memory cells can be read in a forward bias or a reverse bias fashion). Further, in some cases these sets of sense amplifiers can be shared between the planes/banks, and thus may not be dedicated to only one such plane. In addition, pumps and high-voltage multiplexers 1906 can include one charge pump (e.g., positive voltage output) for program/erase operations, and another for read operations. This can allow for adjustment of the charge pump dedicated for program/erase operations during a reconfigured write. Also, each plane/bank may have its own high-voltage multiplexers 1906 in order to decode high voltages for program/erase, and read (e.g., verify) operations.

Separate address buses may be utilized for program/erase and read operations, as shown in FIG. 15. Array plane 1902-L can also include global X-decoders and column decoders 1908-L, sense amplifiers (e.g., shared) 1910-L, memory cell sectors or sub-array blocks 1912-L, and local X-decoders 1914-L. Similarly, array plane 1902-R can include logic circuit 1904-R, which may provide a read enable signal to pumps 1906-R. For example, pumps 1906-R (e.g., including regulators 1604) can be activated for a read operation in response to the read enable control signal, such as when a write operation to array plane 1902-L is reconfigured to accommodate a read command directed to array plane 1902-R. Array plane 1902-R can also include global X-decoders and column decoders 1908-R, sense amplifiers (e.g., shared) 1910-R, memory cell sectors or sub-array blocks 1912-R, and local X-decoders 1914-R.

In particular embodiments, an interface (e.g., 1502) can receive a concurrent read command (while a write operation is ongoing) that triggers reconfiguration of the ongoing write operation. Thus, a controller (e.g., program/erase, read controllers) can detect the concurrent read operation, and in response execute a reconfigured write operation. Reconfigured write control implementation can include none in some cases, or any number of adjustments in control, the voltage/current regulation, and algorithm from a normal write operation to a reconfigured write operation. Such reconfigurations can include the programming mode, charge pump strength (e.g., reduced strength during reconfiguration), oscillation frequency, algorithm adjustment or selection (e.g., select new write operation parameters, such as current/voltage, write pulse width, etc.), just to name a few. The reconfiguration/concurrent trigger can cause registers and logic controlling the write speed, algorithm, and/or strength, etc., to be modified as part of the reconfigured write operation. In addition, none (e.g., in cases of no write operation modifications), or one or more options (e.g., speed, algorithm, strength, etc.) for the write configuration can be programmed in advance, such as during test/characterization. For example, one or more registers can be employed to store information that indicates or defines the reconfigured write operation versus a standard/normal write operation. Once the concurrent read operation is detected to be completed, the controller can return to a normal write operation.

Figure 20:
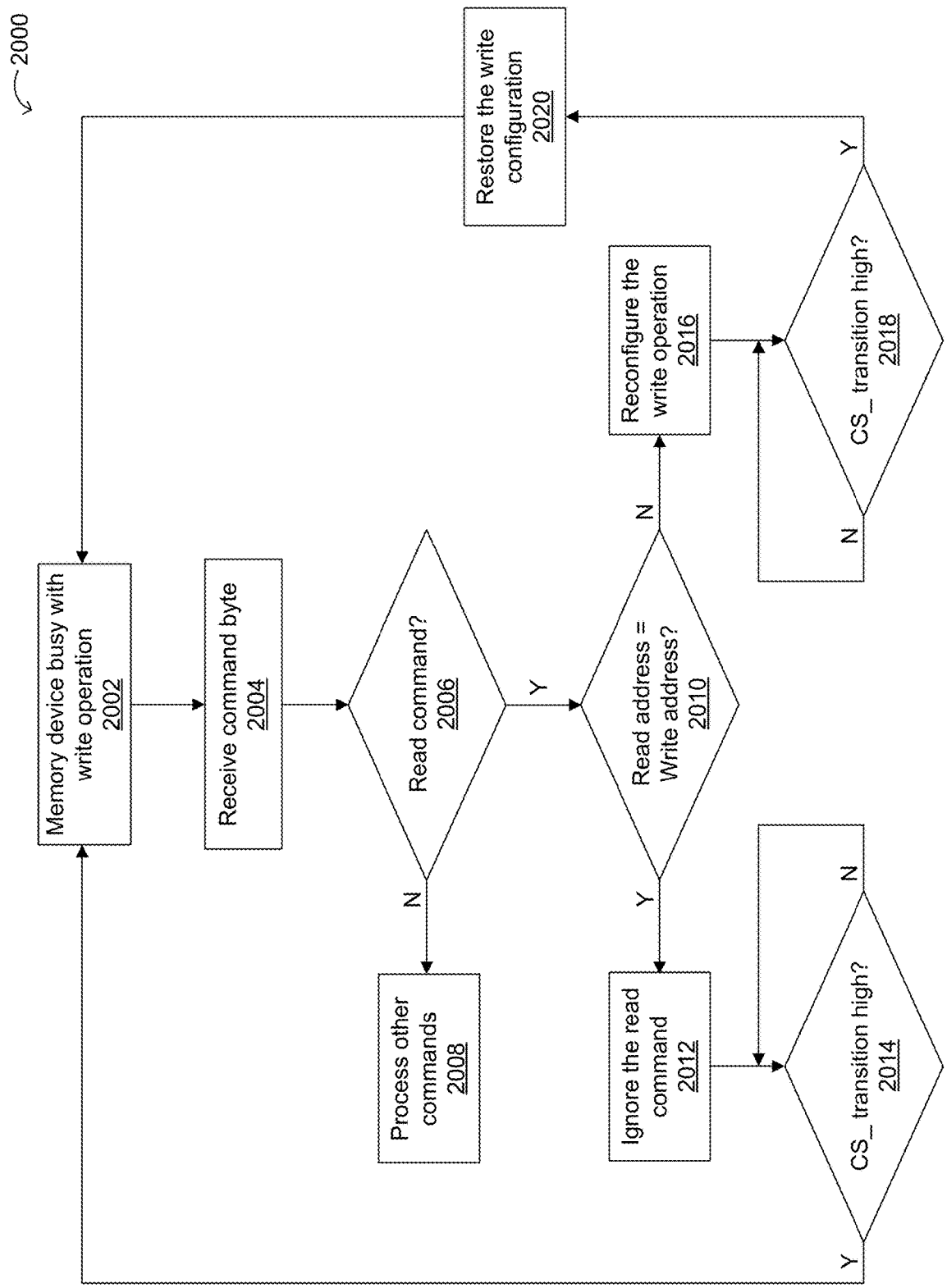
FIG. 20 is a flow diagram of a first example method of controlling a memory device with a concurrent read structure, in accordance with embodiments of the present invention.

Referring now to FIG. 20, shown is a flow diagram of a second example method 2000 of controlling a memory device with a concurrent read structure, in accordance with embodiments of the present invention. At 2002, the memory device may be busy with an ongoing write operation. For example, the write operation can be in response to a previously issued write command, and the write operation can include one or more program or erase pulses applied to array plane 1902-L. At 2004, a command byte can be received via the interface (e.g., 1502). If the command byte is not detected as a read command at 2006, other commands can be processed at 2008. For example, the ongoing write operation can be completed in normal fashion (e.g., with a normal configuration), and/or the new command can be pipelined or otherwise processed without triggering reconfiguration of the ongoing write operation.

If the received command byte is detected as a read command at 2006, there can be a comparison of the read address to the write address at 2010. This can be performed via registers and comparison circuitry such as with respect to the separated read and program/erase address buses (see, e.g., FIG. 15). If the incoming read address matches the ongoing write address, then the read command can be ignored at 2012, and the write operation can continue as a normal write operation (no reconfiguration). The memory device may return to a state of busy with the write operation once the chip select pin transitions to a deactivated high level at 2014. This relocation can be read again later with its updated data state after completion of the normal write operation. If the incoming read address does not match the ongoing write address at 2010, then the write operation can be reconfigured at 2016. As discussed above, such reconfiguration can include any number of adjustments, such as to the write algorithm, charge pump strength, write operation speed, program/erase voltage/current levels, and so on. Once the chip select pin transitions high at 2018, the normal write operation can be restored at 2020, and the memory device can again be in the state of being busy with the write operation at 2002.

As discussed above, the reconfigured write can include saving a state of the write operation, adjustments to voltage regulation values for the reconfigured write operation, slowing down speed of the write operation, etc., for the given array plane (e.g., 1902-L). The concurrent read operation can be executed on another array plane (e.g., 1902-R), while the reconfigured write is being executed on a different array plane (e.g., 1902-L) of the memory array. Once the read operation has completed, or if the read operation is far enough along in the process so as to not be disturbed by noise due to a normally configured write operation, execution of the write operation (e.g., on array plane 1902-L) in a restored normal write configuration can occur at 2020. Once the write operation is restored at 2020, the memory device can return to 2002 whereby the device may be ready for another read command (if issued), which can be detected during execution of the (restored) write operation. In this way, particular embodiments can accommodate concurrent read and write operations in a non-volatile memory device, and including devices with serial interfaces.

Figure 21:
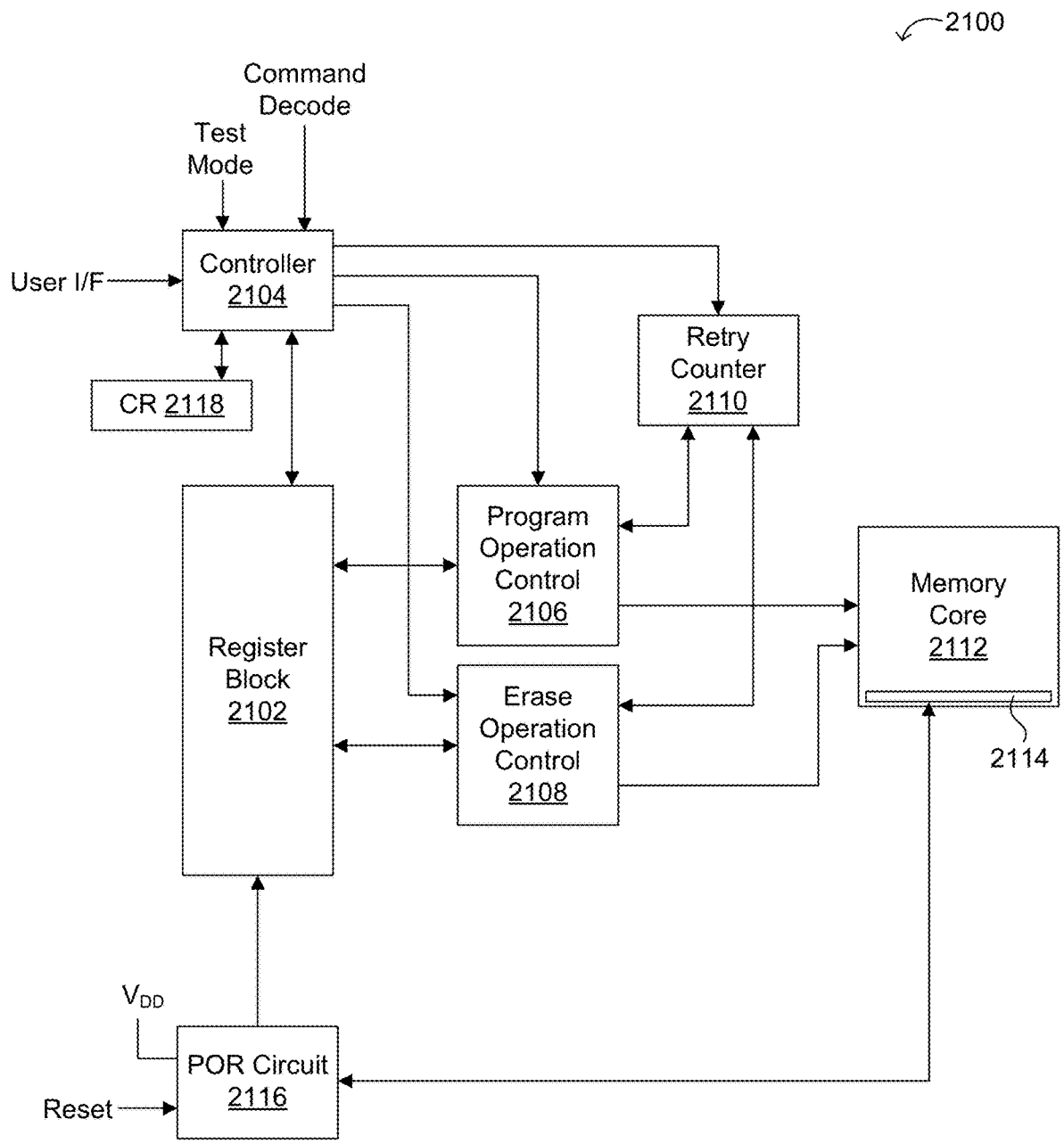
FIG. 21 is a schematic block diagram of an example register and operation control, in accordance with embodiments of the present invention.

Referring now to FIG. 21, shown is a schematic block diagram 2100 of an example register and operation control, in accordance with embodiments of the present invention. For example, register block 2102 can be implemented using SRAM, or in some cases fuse bits. Register block 2102 can provide parameter, algorithm, and/or option variable selections (e.g., in the form of configuration sets) to program operation control 2106 and erase operation control 2108, and which may be used to reconfigure the write operation. Controller 2104 may determine and decode the received command, and can also control access to the register bits in register block 2102, such as for providing to write operation controllers 2106 and 2108. In addition, test modes (e.g., to determine operation distribution, etc.) can be used to override data in register block 2102. Settings for register block 2102 may be based on various default algorithm (e.g., write operation algorithm) and option variable or condition settings for a write operation, but can also be programmed on lot-by-lot or device-by-device basis. Also, values for program operations, erase operations, and option variable or related condition settings (e.g., for "normal" or "reconfigured" write operations), as well as array plane allocation (e.g., by sector) can be independently programmed in register block 2102.

Power-on reset (POR) circuitry or state machine 2116, which can receive a reset signal (e.g., via the RESET_pin), can access designated register data portion 2114 and read out data from that dedicated section of memory array 2112. Designated register data portion 2114 may alternatively be located outside of memory core 2112. In any event, this accessed data that is associated with memory core 2112 may then be loaded into register block 2102. In this way, information specific to this device can be programmed into the memory core, and whenever the device is powered on (e.g., as detected by $V_{DD}$ supply) or otherwise reset, this data can be loaded into register block 2102. This is because the memory core, including designated register data portion 2114 may include non-volatile memory. Also, different applications-based information can be stored in non-volatile memory designated register data portion 2114. Further, different parts or memory cores 2112 can be independently programmed (e.g., for different applications, different configurations, etc.). In some cases, this dedicated portion of memory may not be accessible to the user. However, some applications may allow access to these designated locations, such as in a test mode.

In one or more test modes, controller 2104 can override one or more values stored in register block 2102. When the test mode is complete, data in register block 2102 can revert to the data that was previously stored in the register. For example, registers 2102 may be implemented as two storage bits per register cell, one such bit representing an override value that is only enabled during predetermined modes (e.g., test mode, etc.), and another bit storing the data programmed outside of the test mode (e.g., during standard operation, power up, etc.). As another example, registers 2102 may be implemented as a single bit per cell or stored data bit, and data can be reverted to its previous state by accessing designated register data portion 2114 and asserting the reset signal upon completion of the test mode.

In addition, registers 2102 may be programmable by controller 2104 and/or by a user via a separate or combined user interface. In this way, a user may be able to program data into registers 2102 in order to override or change previous values therein. Particular embodiments may also support independently controlled program/erase algorithm selection for different memory cores 2112. For example, controller 2104 can set the register values in 2102 different for different memory cores 2112. For example, register block 2102 may include dedicated sectors (e.g., a widened register or increased register bit length) for each memory core, or register block 2302 may be replicated for each memory core 2112. This may be utilized whereby one memory array 2112 is dedicated to one application (e.g., code), while another memory array 2112 may be dedicated to another application (e.g., data). In this way, register block 2102 may accommodate independently programmable operation algorithms in support of different operations for different memory cores 2112. Further, the dedicated sectors in this case can each have their own status register with a corresponding ready bit to indicate if that sector of the memory device is busy with an operation, or in a power down state.

Various program/erase operation algorithms, as well as status, information can be stored in register block 2102. For example, at least two bits can be used to indicate which of a predefined group of program algorithms is to be used to execute a program command, such as for a normal program operation versus a reconfigured program operation. Similarly, at least two bits in register block 2102 can be used to indicate which of a predefined group of erase algorithms is to be used to execute an erase command, such as for a normal erase operation versus a reconfigured erase operation. Further, option variables that define conditions/configurations (e.g., pulse widths, voltage levels, current levels, etc.) for the program and erase operations of the selected operation algorithm may also be defined in register block 2102. In addition, a maximum number of retry attempts, which may be embedded within one or more of the program/erase algorithms may also be stored in register block 2102. For example, retry counter 2110 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 2114 can be updated to reflect changed algorithm selections, option variables, etc., values based on such counter results. As a result, register block 2102 can be updated via POR circuit 2116, as discussed above. In another example, incremented values based on the counter results can be dynamically determined based on data output from register block 2102. In this case, data that is read from register block 2102 can then be updated by subsequent circuitry based on the counter results, before being provided as outputs to program operation control 2106 and erase operation control 2108.

In addition, configuration register (CR) 2118 can be included with an interface to controller 2104. Configuration register 2118 can be utilized in defining "reconfigured" write operation conditions or algorithms, and/or may be utilized in setting the "normal" write operation conditions or algorithms. In certain embodiments, configuration 2118 can be used to dynamically configure a given write operation, such as described herein with respect to concurrent read operations. In one case, configuration register 2118 can be user accessible in order to indicate a desired configuration set that is optimized for the given application of the memory (e.g., NVM) device. Upon receiving a write command (e.g., via an external interface), or a trigger to a reconfigured write command, controller 2104 can compare (e.g., on a bit-by-bit basis) the contents of configuration register 2118 against corresponding values in CAM/register block 2102. If there is no match, designated register data portion 2114, or another such portion of memory core 2112, can be accessed to download the appropriate configuration bits into register block 2102. However, if there is a match, indicating that the desired configuration set already resides in register block 2102, the configuration bits can be accessed (e.g., by controller 2104) directly from register block 2102. In any event, program operation control 2106 or erase operation control 2108 (e.g., in conjunction with controller 2104) can access the appropriate configuration bits from register block 2102 in order to optimize the write operation for the given application or use case of the memory device.

Figure 22:
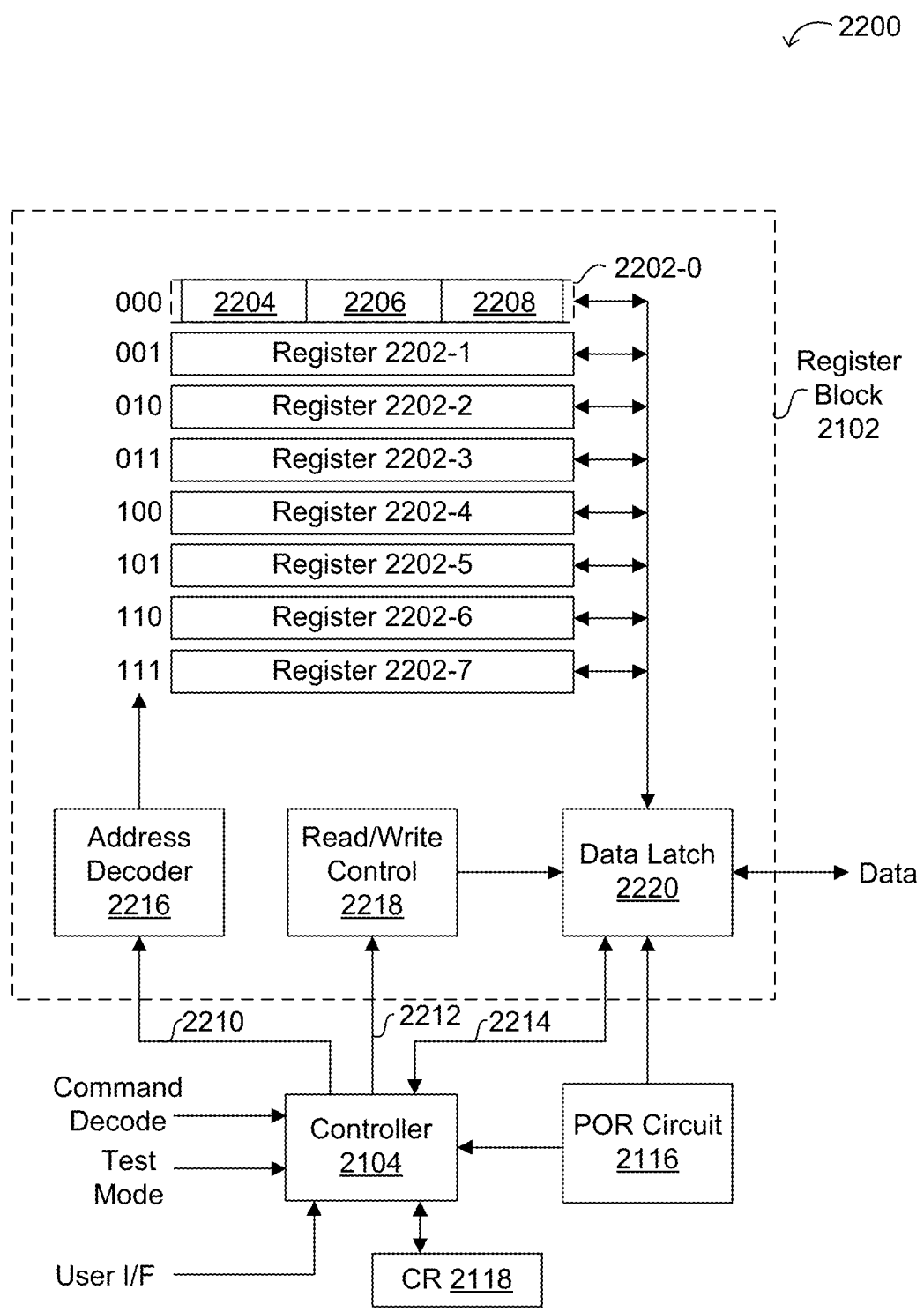
FIG. 22 is a schematic block diagram of an example register structure, in accordance with embodiments of the present invention.

Referring now to FIG. 22, shown is a schematic block diagram 2200 of an example register structure, in accordance with embodiments of the present invention. In this example, register block 2102 can include eight registers 2202 (e.g., 2202-0, 2202-1, . . . 2202-7). Each register 2202 can include a number of fields. For example, field 2204 may be a 2-bit wide field to store data representing erase operation algorithms (e.g., including normal and reconfigured erase operation algorithms). Also for example, field 2206 may be a 2-bit wide field to store data representing program operation algorithms (e.g., including normal and reconfigured program operation algorithms). Also for example, field 2208 may be a 2-bit wide field to store data representing retry loops. Other fields (not shown) may be used to indicate option variables to set conditions for the various algorithms, including normal/reconfigured algorithm settings. Various fields of registers 2202 may generally be used to form or support a conditions table that may be accessed (e.g., by program operation control 2106, erase operation control 2108, etc.) to set the conditions for one or more of the program and erase operations of a selected operation algorithm. Also, while configuration register 2118 is shown as separate from register block 2102, in some cases configuration register 2118 can be implemented as part of register block 2102.

Register block 2102 can also include address decoder 2216, which can receive signals 2210 (e.g., address, address load, etc.) from controller 2104, and may provide 3-bit decoded values to address one of eight registers 2202. Read/write control 2218 can receive signals 2212 (e.g., read control signal, write control signal, etc.) from controller 2104, and may provide a control signal to data latch 2220. Data latch 2220 can receive signals 2214 (e.g., read data strobe, data out enable, load data, etc.) from controller 2104, and may receive or provide the data to/from register block 2102. Also, while only eight registers are shown in the particular example of FIG. 22, any suitable number of registers can be accommodated in particular embodiments. For example, 24 registers can be included, where each register is 8-bits wide. In addition, such registers may support other functions, including those that may be adjusted as part of a reconfigured write operation, such as word line voltage level, compliance current (e.g., where the cell is programmed until reaching this compliance current, X µA), equalization pulse width, single ended or differential sense amplifier configuration, other status information, as well as any number of other device functions and/or parameters.

In certain embodiments, there may be two designated and configurable "zones" or "planes" in the device. The reconfiguration of a write operation when a read operation is detected during execution of the write operation can be accommodated if the read operation designated for one zone is received while the write operation is in progress in the other zone. A read operation designated from a busy zone (e.g., with a write operation ongoing) may yield unpredictable results in some cases. Various approaches can be employed to define or configure the sizes and/or arrangements of the two zones. In some cases, the "B" zone can be configurable to reside in a last ¾, ¼, ²⁄₄ or ¾ of the array, while the A zone may occupy a remaining portion of the memory array. This may a granularity of ¼ of the memory array in the split between the two zones.

In some applications, one zone can be used for program code and the other zone can be used for data storage. Because the amount of code versus the amount of data may typically require finer granularity, such a smaller granularity of ⅛ or ¹⁄₁₆ of the memory array, can be accommodated in some cases. Note that since zones A and B can be fully symmetrical, there may be no difference between selecting zone B to reside in the last ¼ or ¾ of the memory array, as one can always flip between the names or designations of the particular zones. Along these lines, zone B may reside in the last ⁰⁄₈, ⅛, ²⁄₈, ⅜, and ⁴⁄₈ of the memory array in some cases. This approach may utilize an additional configuration option, but can allow a granularity of ⅛th of the memory array in the split between the zones, thus taking into account the ability of one to switch between designations of zones A and B.

In another example, the memory array can be divided into sections whereby each is smaller than the other by a factor of two. In this case, area 1 can be in a first half of the array, area 2 may be in the first half of a remaining portion (sized ¼) of the memory array, area 3 can be in the first half of a remaining portion (sized ⅛), and areas 4 and 5 may be in a first half and a second half of a remaining portion of the memory array (sized ¹⁄₁₆ of the full array size). Zone A can be built out of a combination of any number of these areas in order to form a non-continuous zone of any configurable size between 0 and the full array, with a granularity of ¹⁄₁₆ of the array size. In addition, a mapping function can be overlaid on top of this physical non-continuous zone in order to create a continuous virtual address space.

Referring now to FIG. 23, shown is a diagram of an example address mapping 2500 for array zone configuration, in accordance with embodiments of the present invention. In this example, one or two of the most significant bits (MSBs) can be flipped in order to provide the mapping function between a physical non-continuous zone and a continuous virtual address space. In a particular example, a 32 Mbit memory array can accommodate a 4 Mbit granularity, whereby only MSBs 21 and 20 need be changed, as shown in the table of FIG. 23.

Figure 24:
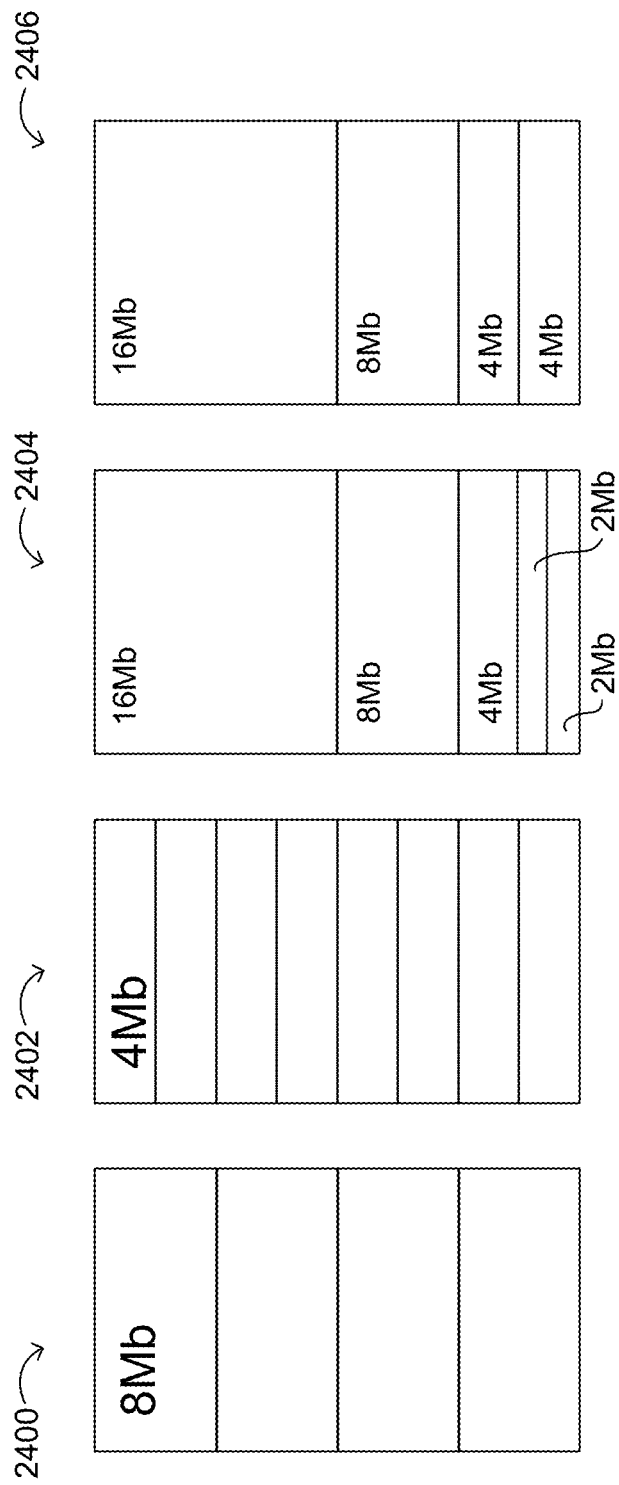
FIG. 24 is a block diagram of example array configurations for concurrent read and write operations, in accordance with embodiments of the present invention.

Referring now to FIG. 24, shown is a block diagram of example array configurations for concurrent read and write operations, in accordance with embodiments of the present invention. In general, a read command may function substantially the same whether or not a write operation is in progress, but the write operation can be reconfigured when interrupted by a read operation to the other zone/plane. In example 2400, a memory array can be configured (e.g., via a register 2202) into two regions with 8 Mb granularity (e.g., one zone of 8 Mb, and another zone of 24 Mb). As discussed above, various options can be supported for finer granularity. In example 2402, a granularity of 4 Mb can be accommodated, such as by doubling instances of column multiplexers (YMUX). In example 2404, one 8 Mb block can essentially be broken into a 4 Mb block and two 2 Mb blocks, which can allow for a granularity of 1/16 of the size of the memory array. In example 2406, one 8 Mb block can be broken into two 4 Mb blocks.

Read commands can be accepted when a write operation is not taking place in a same region or zone. Also, a datasheet specification can include a delay between starting a write operation and entering a read command. Further, various write operation reconfiguration procedures can include specific controls of high-voltage (e.g., charge pumped) regulated levels that are used for write operations. In some cases, discharge of such a high voltage level can be intentionally slowed and/or held off for a predetermined amount of time once entering the reconfigured write mode. In other cases, the high voltage level can be maintained in a standby/quiescent state instead of discharging this level during the reconfigured write mode. For example, standby pumps can be activated simply to maintain the high voltage level via a charge pump circuit, and this may be sufficient to maintain this level during the reconfigured write mode, or to be reduced or slowed down, as discussed above.

Execution of a write operation on a first array plane/zone of a memory array can occur in response to a previously issued write command, and the write operation can include a program or erase pulse applied to an array plane (e.g., 1902-L). For example, the chip select pin can transition from high to low, in order to detect the start of a new instruction (see, e.g., 1102 of FIG. 11). Once the instruction has been decoded to determine that the incoming operation is a read operation, the reconfigured write mode can be entered. In some cases, the write state can be stored, which may include saving a state of the write operation, discharging or maintaining (e.g., in a quiescent or standby state) voltage regulation values for the write operation, maintaining other write circuitry for the given array plane, as well as any other suitable functions, in order to allow for a subsequent restoration of the write operation. The read operation can be executed on a second array plane/zone (e.g., 1902-R) of the memory array. For example, the read command can include additional checks as to the command relative to the region to which the read is directed to ensure that the read access is to a different plane/zone than that of the ongoing write operation.

Once the read operation has completed, or if the read operation is far enough along in the process so as to not be disturbed by noise due to a restored write operation, execution of the write operation on the first array plane can be restored to its normal configuration. This restoration of the write operation can include restoration of the previously stored write state, such as in the case of a write suspension. Further, it may be specified that no chip select the activity or new commands be issued for a predetermined amount of time (e.g., 10 µs), $T_{res}$, or number of cycles. In this way, particular embodiments can accommodate concurrent read and write operations in a non-volatile memory device, and in particular for serial or narrow width device interfaces.

Figure 25:
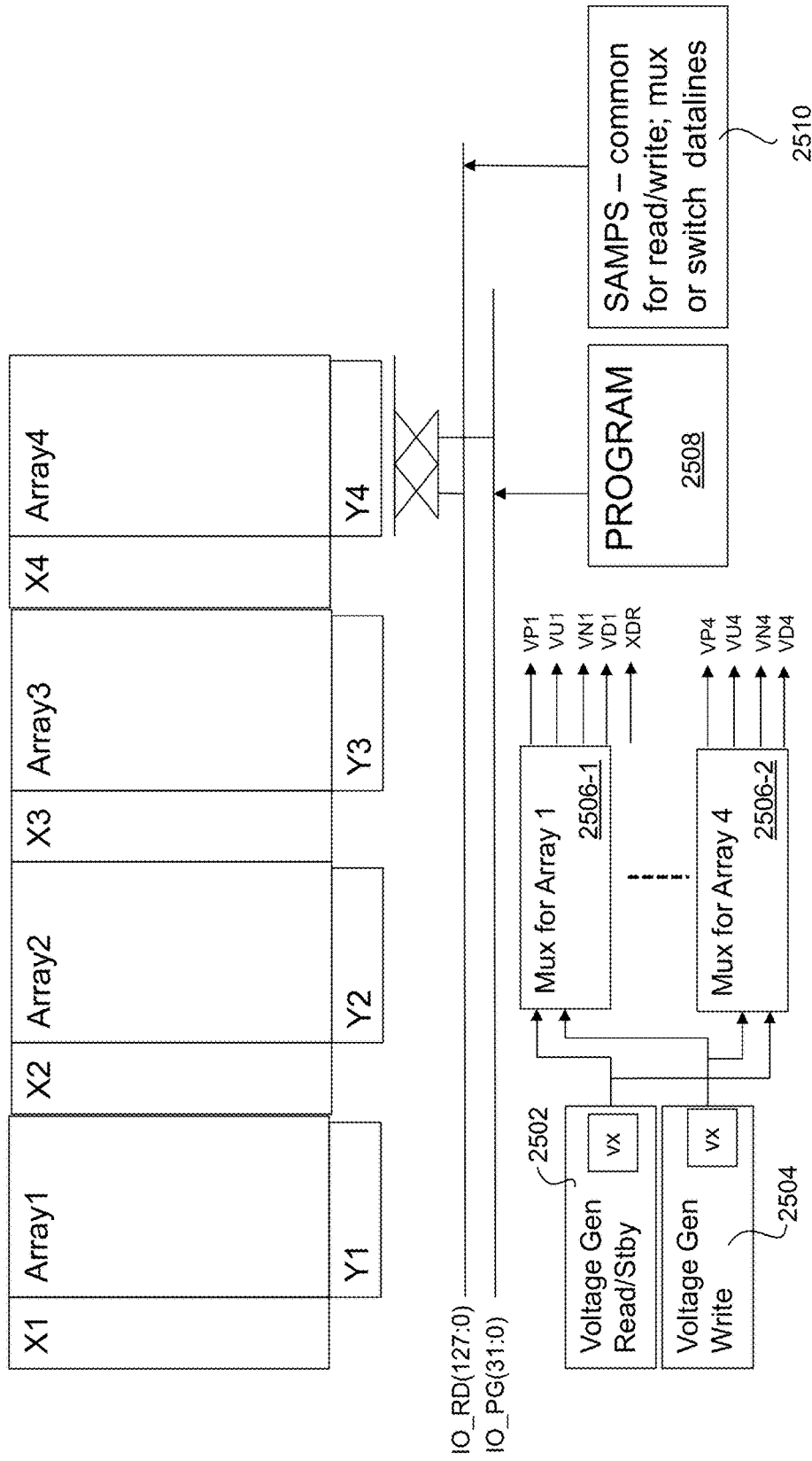
FIG. 25 is a schematic block diagram of an example architecture 2700 with concurrent read and write operation support, in accordance with embodiments of the present invention.

Referring now to FIG. 25, shown is a schematic block diagram of an example architecture 2500 with concurrent read and write operation support, in accordance with embodiments of the present invention. In this particular example, two sets of I/O or data lines can be included, with one set (e.g., IO_PG[31:0]) being dedicated for write operations, and the other set (e.g., IO_RD[127:0]) being dedicated for read operations. Thus, an additional level of multiplexing can be included at the array level. Arrangement 2500 can also include a memory array (e.g., 1508) configured as four sub-arrays that may support a granularity of one fourth of the memory array size for plane/zone configuration. For example, each of the sub-arrays can be 8 Mb for a 32 Mb memory array, and this architecture can support configuration or designation of each of the sub-arrays into zone A or zone B. In addition, a mapping function (see, e.g., FIG. 23) can be employed whereby a continuous virtual address space can be mapped to a non-continuous physical address space.

The regulators in 2500 can include voltage generator for read and standby operations 2502. For example, regulator 2502 can be enabled for read operations only, or may be enabled for read operations as well as reconfigured write operations (e.g., to maintain high-voltage levels in a standby state). Regulator 2504 can be designated strictly for program and erase operations, and may be adjustable for reconfigured write operations. Regulators 2502 and 2504 can be provided via multiplexers 2506 to corresponding arrays, as shown. Also, program control 2508 can be employed during write operations to drive the I/O and data lines to their appropriate states. In addition, sense amplifiers 2510 can be common for read and write operations, and data lines may be multiplexed or otherwise switched. In other cases, sense amplifiers for write operations may be separated from sense amplifiers for read operations (see, e.g., FIG. 19) in order to facilitate reconfiguration of the write operation.

In some cases, a write operation that is restored after being reconfigured due to and interrupting read operation can take from about 300 ns to about 10 µs, such as from about 1 µs to about 3 µs (e.g., about 1.5 µs). Various approaches to controlling regulators, such as high-voltage charge pumps, can be accommodated. For example, control of the regulators can be frozen or maintained as if the write operation is ongoing for a predetermined amount of time after entering the reconfiguration mode. Additionally, or in other approaches, standby charge pumping can occur after this predetermined amount of time has elapsed, or immediately upon entering the reconfiguration mode. In another approach, read/write sharing and/or handshaking can occur whereby once the read operation is far enough along (e.g., when data is being streamed out), high-voltage charge pumping can occur in anticipation of the restored write operation, or the write operation can immediately resume.

The reconfiguration feature can allow the NVM device to be read while a program or erase operation is in progress, without substantial additional management or by incurring additional delays in the read operation. This feature may require the minimum CS high time ($T_{csh}$) be observed, and various read commands (e.g., 0x03, 0x3B) can be entered and may function as if no write is in progress, while any ongoing write operation is reconfigured. In some cases, other commands that are not designated as suitable read operation commands that will interrupt a write operation can be ignored (see, e.g., 2012 in FIG. 20). As discussed above, the read and write (ER or PGM) operations may occur in different planes or zones of the memory array. The NVM device can support two configurable planes having an address space that is set via register (see, e.g., FIG. 23).

If the incoming read command were to target a same address space/zone as the ongoing write operation, the write operation may continue, and an error code may be output instead of valid data. In another example of the incoming read command targeting the same address space/zone as the ongoing write operation, the write operation may still be reconfigured. In any case, this inappropriate read command may not be executed, and an error code may be output instead of valid data, and as opposed to the read command simply being ignored. Alternatively, an error bit may be set in a status register instead of outputting an error code in these cases.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device, comprising:
   a) a memory array comprising a plurality of memory cells;
   b) a first array plane and a second array plane designated from the memory array;
   c) an interface configured to receive write and read commands from a host, wherein write operations begin in a first write control state; and
   d) a memory controller configured to change from the first write control state to a second write control state to reconfigure an ongoing write operation on the first array plane and to execute a read operation on the second array plane in response to the read command being received during the write operation, and to change from the second write control state to the first write control state to restore the configuration of the write operation after the read operation has at least partially been executed.

2. The memory device of claim 1, wherein the memory array is divided into a plurality of sub-arrays, and each of the sub-arrays is dynamically assigned to the first array plane or the second array plane.

3. The memory device of claim 1, wherein the memory array comprises a plurality of first sense amplifiers dedicated to verify operations, and a plurality of second sense amplifiers dedicated to read operations.

4. The memory device of claim 1, further comprising a regulator control circuit having first bias circuitry dedicated to write operations, and second bias circuitry dedicated to read operations.

5. The memory device of claim 1, wherein the reconfiguration of the write operation comprises changing a rate of the reconfigured write operation.

6. The memory device of claim 1, wherein the reconfiguration of the write operation comprises changing a write algorithm of the reconfigured write operation.

7. The memory device of claim 1, wherein virtual addresses are mapped to physical addresses of the memory array in response to a register.

8. The memory device of claim 1, further comprising a regulator control circuit configured to adjust control of a regulator for the write operation when the write operation is reconfigured.

9. The memory device of claim 8, wherein the regulator control adjustment comprises maintaining the regulator in a standby state.

10. The memory device of claim 8, wherein the regulator control adjustment comprises maintaining an output of the regulator for a predetermined amount of time upon reconfiguration of the write operation.

11. The memory device of claim 1, wherein the first array plane and the second array plane contain an equal number of the plurality of memory cells.

12. The memory device of claim 1, wherein the first array plane contains a different number of the plurality of memory cells than in the second array plane.

13. A method of controlling a memory device, the method comprising:
   a) designating a first array plane and a second array plane from among a memory array having a plurality of memory cells;
   b) receiving, by an interface, a write command from a host, wherein write operations begin in a first write control state;
   c) beginning execution of a write operation on the first array plane of a memory array in response to the write command;
   d) receiving, by the interface, a read command from the host;
   e) reconfiguring the write operation to change from the first write control state to a second write control state in response to detection of the read command during execution of the write operation;
   f) beginning execution of a read operation on the second array plane in response to the read command; and
   g) restoring the configuration of the write operation to change from the second write control state to the first write control state after the read operation has at least partially been executed.

14. The method of claim 13, wherein the designating the first and second array planes comprises dynamically assigning each of a plurality sub-arrays to the first array plane or the second array plane, wherein the memory array is divided into the plurality of sub-arrays.

15. The method of claim 13, wherein the designating the first and second array planes comprises mapping virtual addresses to physical addresses of the memory array such that the virtual addresses of the plurality of memory cells are contiguous within each of the first and second array planes.

16. The method of claim 13, further comprising adjusting, by a regulator control circuit, control of a regulator for the write operation when the write operation is reconfigured.

17. The method of claim 16, wherein the regulator control adjusting comprises maintaining the regulator in a standby state.

18. The method of claim 16, wherein the regulator control adjusting comprises maintaining an output of the regulator for a predetermined amount of time upon reconfiguration of the write operation.

19. The method of claim 13, wherein the reconfiguring the write operation comprises changing a rate of the reconfigured write operation.

20. The method of claim 13, wherein the reconfiguring the write operation comprises changing a write algorithm of the reconfigured write operation.

* * * * *